(12) United States Patent
Fan

(10) Patent No.: US 11,462,406 B2
(45) Date of Patent: Oct. 4, 2022

(54) SEMICONDUCTOR DEVICE STRUCTURE WITH FINE BORON NITRIDE SPACER PATTERNS AND METHOD FOR FORMING THE SAME

(71) Applicant: NANYA TECHNOLOGY CORPORATION, New Taipei (TW)

(72) Inventor: Pei Cheng Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 74 days.

(21) Appl. No.: 16/942,049

(22) Filed: Jul. 29, 2020

(65) Prior Publication Data
US 2022/0037155 A1 Feb. 3, 2022

(51) Int. Cl.
*H01L 21/033* (2006.01)

(52) U.S. Cl.
CPC ...... *H01L 21/0337* (2013.01); *H01L 21/0332* (2013.01)

(58) Field of Classification Search
CPC .................. H01L 21/0332; H01L 21/0337
See application file for complete search history.

(56) References Cited

U.S. PATENT DOCUMENTS

| 9,887,135 B1* | 2/2018 | Wallner | ................ H01L 27/088 |
| 2015/0287612 A1* | 10/2015 | Luere | ................ H01L 21/32139 |
| | | | 438/703 |
| 2017/0200738 A1 | 7/2017 | Kim et al. | |
| 2020/0343138 A1* | 10/2020 | Jisong | ............. H01L 21/823814 |

* cited by examiner

*Primary Examiner* — Walter H Swanson
(74) *Attorney, Agent, or Firm* — Muncy, Geissler, Olds & Lowe, P.C.

(57) ABSTRACT

The present disclosure provides a semiconductor device structure with fine boron nitride spacer patterns and a method for forming the semiconductor device structure, which can prevent the collapse of the fine patterns. The semiconductor device structure includes a first target structure and a second target structure disposed over a semiconductor substrate. The semiconductor device structure also includes a first boron nitride spacer disposed over the first target structure, wherein a topmost point of the first boron nitride spacer is between a central line of the first target structure and a central line of the second target structure in a cross-sectional view.

11 Claims, 21 Drawing Sheets

SEMICONDUCTOR DEVICE STRUCTURE WITH FINE BORON NITRIDE SPACER PATTERNS AND METHOD FOR FORMING THE SAME

TECHNICAL FIELD

The present disclosure relates to a semiconductor device structure with fine boron nitride spacer patterns and a method for forming the same, and more particularly, to a method for preventing the collapse of the fine patterns.

DISCUSSION OF THE BACKGROUND

As semiconductor device structures become smaller and more highly integrated, a number of technologies for fabricating fine patterns for semiconductor device structures have been developed. Particularly, photolithography processes are typically used to fabricate electronic and optoelectronic devices on a substrate, and photoresist patterns prepared by the photolithography processes are used as masks in etching or ion implantation processes. As the required pitch size and critical dimension (CD) continue to shrink, the fineness of the photoresist patterns becomes a very important factor in determining the degree of integration. However, photolithographic processes for fabricating semiconductor features have presented a limitation in the increase of resolution of the exposure apparatus.

Although existing semiconductor device structures with fine patterns and methods for manufacturing the same have been adequate for their intended purposes, they have not been entirely satisfactory in all respects. Therefore, to date, there are still some problems to be overcome in regards to the technologies of forming semiconductor device structures with fine patterns using photolithography processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first inner spacer element disposed over a top surface of a semiconductor substrate. The first inner spacer element includes a first portion, a second portion, and a third portion between the first portion and the second portion. A height of the first portion and a height of the second portion are less than a height of the third portion, and a width of the first portion increases continuously as the first portion extends toward the top surface of the semiconductor substrate. The semiconductor device structure also includes a first outer spacer element of boron nitride disposed over the second portion of the first inner spacer element.

In some embodiments, the first portion of the first inner spacer element includes a first side adjoining a lower portion of a first sidewall surface of the third portion, a second side adjoining the top surface of the semiconductor substrate, and an exterior surface connected to the first side and the second side. The exterior surface has a convex shape. In some embodiments, the first outer spacer element adjoins a second sidewall surface of the third portion, and the first outer spacer element is separated from the top surface of the semiconductor substrate by the second portion. In some embodiments, the first inner spacer element is a stress-extension film, and the first outer spacer element is a stress-compression film. In some embodiments, the first inner spacer element is a stress-compression film, and the first outer spacer element is a stress-extension film. In some embodiments, the semiconductor device structure further includes a second inner spacer element and a second outer spacer element of boron nitride. The second inner spacer element is disposed over the top surface of the semiconductor substrate, and the second inner spacer element includes a fourth portion, a fifth portion, and a sixth portion between the fourth portion and the fifth portion. A width of the fourth portion increases continuously as the fourth portion extends toward the top surface of the semiconductor substrate, and the fourth portion is between the sixth portion and the first portion of the first inner spacer element. The second outer spacer element is disposed over the fifth portion of the second inner spacer element. In some embodiments, the fourth portion of the second inner spacer element is separated from the first portion of the first inner spacer element.

In another embodiment of the present disclosure, a semiconductor device structure is provided. The semiconductor device structure includes a target layer disposed over a semiconductor substrate, and a first target structure disposed over the target layer. The first target structure incudes a first portion, a second portion, and a third portion connected to the first portion and the second portion. A height of the first portion and a height of the second portion are greater than a height of the third portion. The semiconductor device structure also includes a first boron nitride spacer disposed over the first portion of the first target structure, and a second boron nitride spacer disposed over the second portion of the first target structure.

In some embodiments, the first target structure and the target layer are made of the same material, and the first boron nitride spacer and the second boron nitride spacer are made of the same material. In some embodiments, a topmost point of the first boron nitride spacer is between a central line of the first portion and a central line of the second portion in a cross-sectional view. In some embodiments, a topmost point of the second boron nitride spacer is between the central line of the first portion and the central line of the second portion in the cross-sectional view. In some embodiments, the semiconductor device structure further includes a second target structure, a third boron nitride spacer, and a fourth boron nitride spacer. The second target structure is disposed over the target layer. The second target structure includes a fourth portion, a fifth portion, and a sixth portion connected to the fourth portion and the fifth portion, and the fourth portion, the fifth portion and the sixth portion form a U-shaped structure. The third boron nitride spacer is disposed over the fourth portion of the second target structure, and the fourth boron nitride spacer is disposed over the fifth portion of the second target structure. In some embodiments, the third boron nitride spacer is between the second boron nitride spacer and the fourth boron nitride spacer, and a topmost point of the third boron nitride spacer is between a central line of the fourth portion and a central line of the fifth portion in a cross-sectional view. In some embodiments, a first opening, between the second boron nitride spacer and the third boron nitride spacer is deeper than a second opening between the first boron nitride spacer and the second boron nitride spacer. In some embodiments, the semiconductor device structure further includes a hard mask structure formed between the first boron nitride spacer and the first portion of the first target structure, and the hard mask structure has a high etching selectivity against the first boron nitride spacer.

In yet another embodiment of the present disclosure, a semiconductor device structure is provided. The semiconductor device structure includes a first target structure and a second target structure disposed over a semiconductor substrate. The semiconductor device structure also includes a first boron nitride spacer disposed over the first target structure, wherein a topmost point of the first boron nitride spacer is between a central line of the first target structure and a central line of the second target structure in a cross-sectional view.

In some embodiments, the semiconductor device structure further includes a second boron nitride spacer disposed over the second target structure, wherein a topmost point of the second boron nitride spacer is between the central line of the first target structure and the central line of the second target structure in the cross-sectional view. In some embodiments, the first target structure has a high etching selectivity against the first boron nitride spacer. In some embodiments, the first target structure and the second target structure are made of a thermal decomposable material, a photonic decomposable material, or an e-beam decomposable material. In some embodiments, a top surface of the semiconductor substrate is exposed between the first target structure and the second target structure.

Embodiments of a semiconductor device structure and methods for forming the same are provided. The method for forming the semiconductor device structure may include undercutting a photoresist pattern over a semiconductor substrate, and forming an inner spacer element over a sidewall surface of the photoresist pattern. The inner spacer element has a portion extending into a recess (i.e., the undercut region) of the photoresist pattern to form a footing, and a width of the portion of the inner spacer element increases continuously as the portion extends toward the semiconductor substrate. As a result, the inner spacer element may be prevented from collapsing after removal of the photoresist pattern.

Alternatively, the method for forming the semiconductor device structure may include forming a hard mask pillar over a target material, forming a spacer over a sidewall surface of the hard mask pillar, and etching the target material and the hard mask pillar using the spacer as a mask to form a spacer element over a target structure. The spacer element may be prevented from collapsing due to support from the target structure.

Alternatively, the method for forming the semiconductor device structure may include forming an energy removable pattern over a target material, forming a spacer over a sidewall surface of the energy removable pattern, forming a dielectric layer surrounding the energy removable pattern and the spacer, and etching the energy removable pattern, the dielectric layer and the target material using the spacer as a mask to form a spacer element over a target structure. The spacer element may be prevented from collapsing due to high etching selectivity in the etching process for forming the spacer element.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
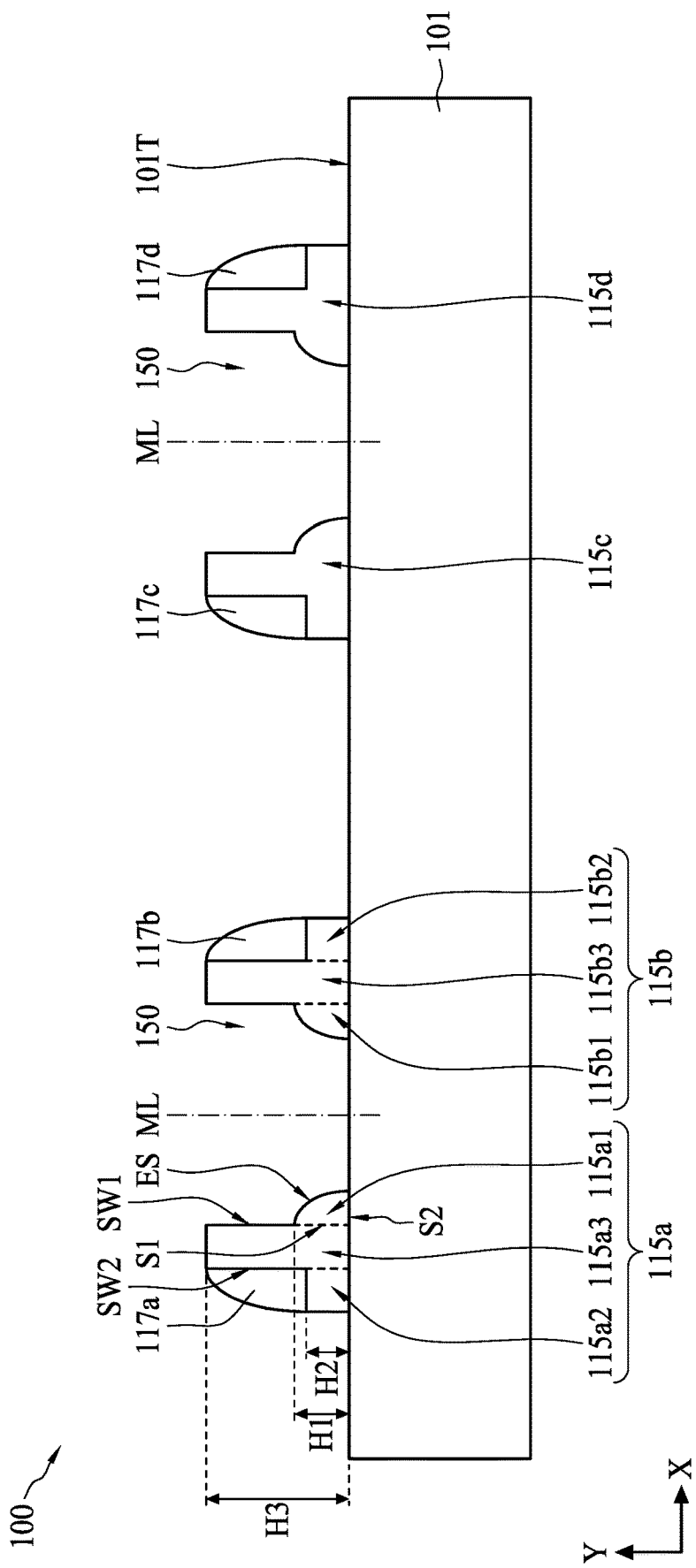
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes inner spacer elements 115a, 115b, 115c, 115d and outer spacer elements 117a, 117b, 117c, 117d over a top surface 101T of a semiconductor substrate 101, in accordance with some embodiments.

More specifically, the inner spacer element 115a includes a first portion 115a1, a second portion 115a2, and a third portion 115a3 between the first portion 115a1 and the second portion 115a2. Similarly, the inner spacer element 115b includes a fourth portion 115b1, a fifth portion 115b2, and a sixth portion 115b3 between the fourth portion 115b1 and the fifth portion 115b2.

No obvious interfaces exist between the second portion 115a2 and the third portion 115a3, and between the third portion 115a3 and the first portion 115a1. Similarly, no obvious interfaces exist between the fourth portion 115b1 and the sixth portion 115b3, and between the sixth portion 115b3 and the fifth portion 115b2. The dotted lines shown in FIG. 1 are to clarify the disclosure. In addition, for the purpose of simplicity and clarity, the sub-portions of the inner spacer elements 115a, 115b, 115c and 115d are only designated in the left half of the semiconductor device structure 100. It should be noted that the right half of the semiconductor device structure 100 may have features similar to those of the left half of the semiconductor device structure 100.

In the inner spacer element 115a, the first portion 115a1 has a height H1 along the Y-direction, the second portion 115a2 has a height H2 along the Y-direction, and the third portion 115a3 has a height H3 along the Y-direction. In some embodiments, the height H3 is greater than the height H1 and the height H2. Moreover, the first portion 115a1 has a width along the X-direction, and the width increases continuously as the first portion 115a1 extends toward the top surface 101T of the semiconductor substrate 101.

It should be noted that, in the inner spacer element 115a, the first portion 115a1 has a first side S1, a second side S2, and an exterior surface ES connected to the first side S1 and the second side S2. In some embodiments, the first side S1 of the first portion 115a1 adjoins a lower portion of a first sidewall surface SW1 of the third portion 115a3, the second side S2 of the first portion 115a1 adjoins the top surface 101T of the semiconductor substrate 101, and the exterior surface ES of the first portion 115a1 has a convex shape.

The features of the inner spacer elements 115b, 115c and 115d may be similar to the abovementioned features of the inner spacer element 115a, and descriptions thereof are not repeated herein. For example, a width of the fourth portion 115b1 along the X-direction increases continuously as the fourth portion 115b1 extends toward the top surface 101T of the semiconductor substrate 101, in accordance with some embodiments.

In addition, the outer spacer element 117a is disposed over the second portion 115a2 of the inner spacer element 115a, and the outer spacer element 117b is disposed over the fifth portion 115b2 of the inner spacer element 115b, as shown in FIG. 1 in accordance with some embodiments. More specifically, the outer spacer element 117a adjoins a second sidewall surface SW2 of the third portion 115a3 of the inner spacer element 115a, and the outer spacer element 117a is separated from the top surface 101T of the semiconductor substrate 101 by the second portion 115a2, in accordance with some embodiments.

The first sidewall surface SW1 and the second sidewall surface SW2 form two opposite sidewall surfaces of the third portion 115a3. The features of the outer spacer elements 117b, 117c and 117d may be similar to the abovementioned features of the outer spacer element 117a, and descriptions thereof are not repeated herein. Furthermore, the inner spacer elements 115a, 115b, 115c and 115d are separated from each other.

In some embodiments, the inner spacer element 115a and the inner spacer element 115b are substantially symmetric with respect to a middle line ML between the inner spacer element 115a and the inner spacer element 115b. In some embodiments, the outer spacer element 117a and the outer spacer element 117b are substantially symmetric with respect to the middle line ML. In some embodiments, the first portion 115a1 and the second portion 115b1 are substantially symmetric with respect to a middle line between the first portion and the second portion.

Figure 2:
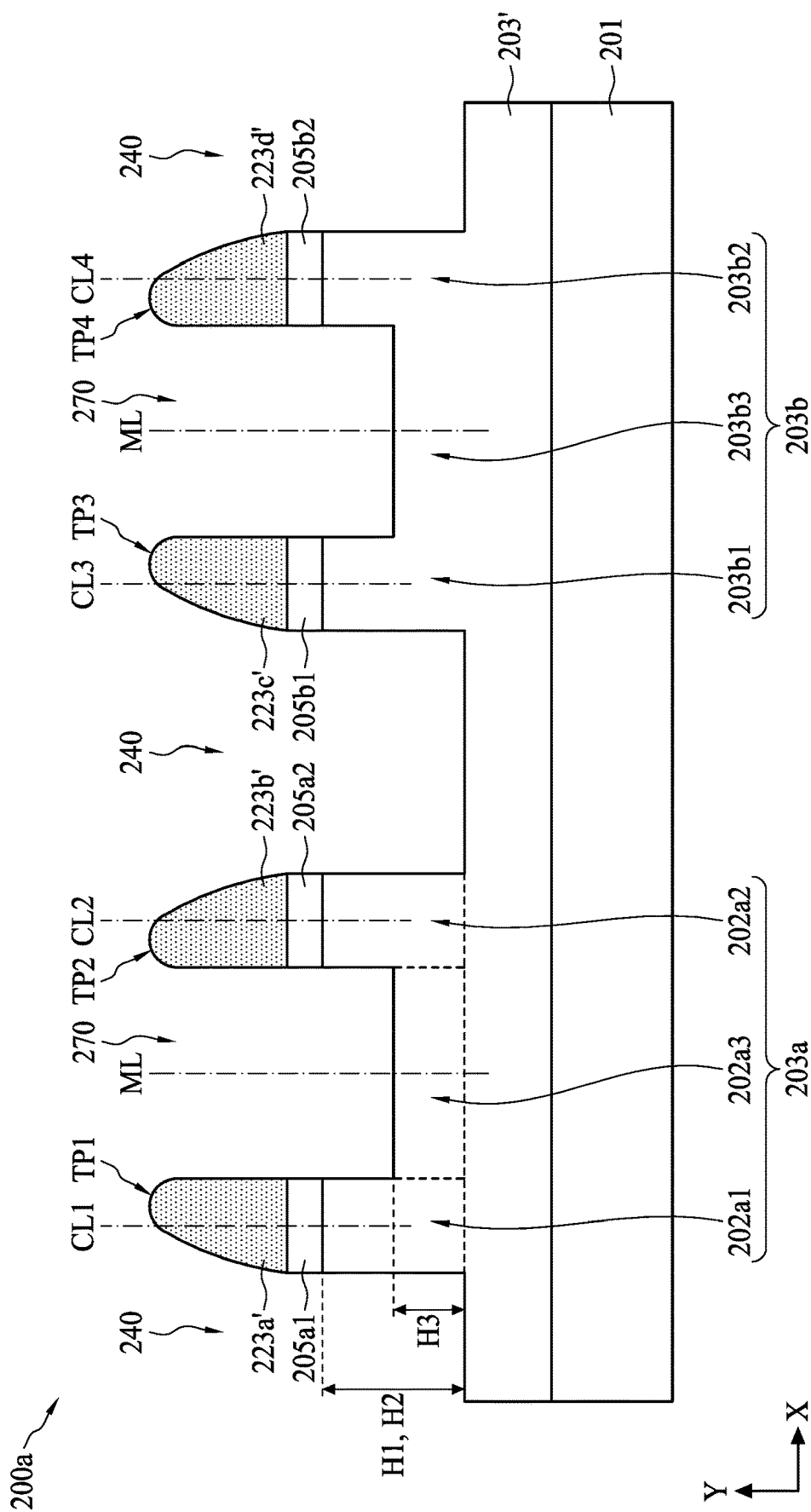
FIG. 2 is a cross-sectional view illustrating a semiconductor device structure, in accordance with some embodiments.

FIG. 2 is a cross-sectional view illustrating a semiconductor device structure 200a, in accordance with some embodiments. As shown in FIG. 2, the semiconductor device structure 200a includes a target layer 203' disposed over a semiconductor substrate 201, and target structures 203a and 203b disposed over the target layer 203', in accordance with some embodiments.

No obvious interfaces exist between the target structures 203a and the target layer 203', and between the target structure 203b and the target layer 203'. The dotted lines shown in FIG. 2 are to clarify the disclosure. It should be noted that the target structures 203a and 203b and the target layer 203' are made of the same material, and are formed simultaneously from the same material layer, in accordance with some embodiments.

More specifically, the target structure 203a includes a first portion 203a1, a second portion 203a2, and a third portion 203a3 between the first portion 203a1 and the second portion 203a2. Similarly, the target structure 203b includes a fourth portion 203b1, a fifth portion 203b2, and a sixth portion 203b3 between the fourth portion 203b1 and the fifth portion 203b2.

No obvious interfaces exist between the first portion 203a1 and the third portion 203a3, and between the third portion 203a3 and the second portion 203a2. Similarly, no obvious interfaces exist between the fourth portion 203b1 and the sixth portion 203b3, and between the sixth portion 203b3 and the fifth portion 203b2. The dotted lines shown in FIG. 2 are to clarify the disclosure.

In the target structure 203a, the first portion 203a1 has a height H1 along the Y-direction, the second portion 203a2 has a height H2 along the Y-direction, and the third portion 203a3 has a height H3 along the Y-direction. In some embodiments, the first height H1 is substantially the same as the height H2, and the height H3 is greater than both the heights H1 and H2. Within the context of this disclosure, the word "substantially" means preferably at least 90%, more preferably 95%, even more preferably 98%, and most preferably 99%. In some embodiments, the first portion 203a1, the second portion 203a2 and the third portion 203a3 form a U-shaped structure.

The features of the target structure 203b may be similar to the abovementioned features of the target structure 203a and descriptions thereof are not repeated herein. For example, the fourth portion 203b1, the fifth portion 203b2 and the sixth portion 203b3 form another U-shaped structure, in accordance with some embodiments.

In some embodiments, the semiconductor device structure 200a also includes a hard mask structure 205a1 disposed over the first portion 203a1 of the target structure 203a, a hard mask structure 205a2 disposed over the second portion 203a2 of the target structure 203a, a hard mask structure 205b1 disposed over the fourth portion 203b1 of the target structure 203b, and a hard mask structure 205b2 disposed over the fifth portion 203b2 of the target structure 203b. The hard mask structures 205a1, 205a2, 205b1 and 205b2 are made of the same material, and are formed simultaneously from the same material layer, in accordance with some embodiments.

In some embodiments, the semiconductor device structure 200a further includes a boron nitride spacer 223a' disposed over the hard mask structure 205a1, a boron nitride spacer 223b' disposed over the hard mask structure 205a2, a boron nitride spacer 223c' disposed over the hard mask structure 205b1, and a boron nitride spacer 223d' disposed over the hard mask structure 205b2. The boron nitride spacers 223a', 223b', 223c' and 223d' are made of the same material, and are formed simultaneously from the same material layer, in accordance with some embodiments.

As shown in the cross-sectional view of FIG. 2, the first portion 203a1 of the target structure 203a has a central line CL1, the second portion 203a2 of the target structure 203a has a central line CL2, the fourth portion 203b1 of the target structure 203b has a central line CL3, and the fifth portion 203b2 of the target structure 203b has a central line CL4. Moreover, the boron nitride spacer 223a' has a topmost point TP1, the boron nitride spacer 223b' has a topmost point TP2, the boron nitride spacer 223c' has a topmost point TP3, and the boron nitride spacer 223d' has a topmost point TP4.

Specifically, in the cross-sectional view of FIG. 2, the topmost point TP1 of the boron nitride spacer 223a' and the topmost point TP2 of the boron nitride spacer 223b' are between the central line CL1 and the central line CL2, and the topmost point TP3 of the boron nitride spacer 223c' and the topmost point TP4 of the boron nitride spacer 223d' are between the central line CL3 and the central line CL4, in accordance with some embodiments.

In addition, in some embodiments, openings 270 are disposed over the target structures 203a and 203b, and openings 240 are formed between adjacent target structures (e.g., between the target structures 203a and 203b). In some embodiments, the boron nitride spacers 223a' and 223b' are separated by one of the openings 270, the boron nitride spacers 223c' and 223d' are separated by the other opening 270, and the boron nitride spacers 223b' and 223c' are separated by one of the openings 240. It should be noted that the openings 240 are deeper than the openings 270 (i.e., extending to a lower level in the Y-direction), in accordance with some embodiments.

Figure 3:
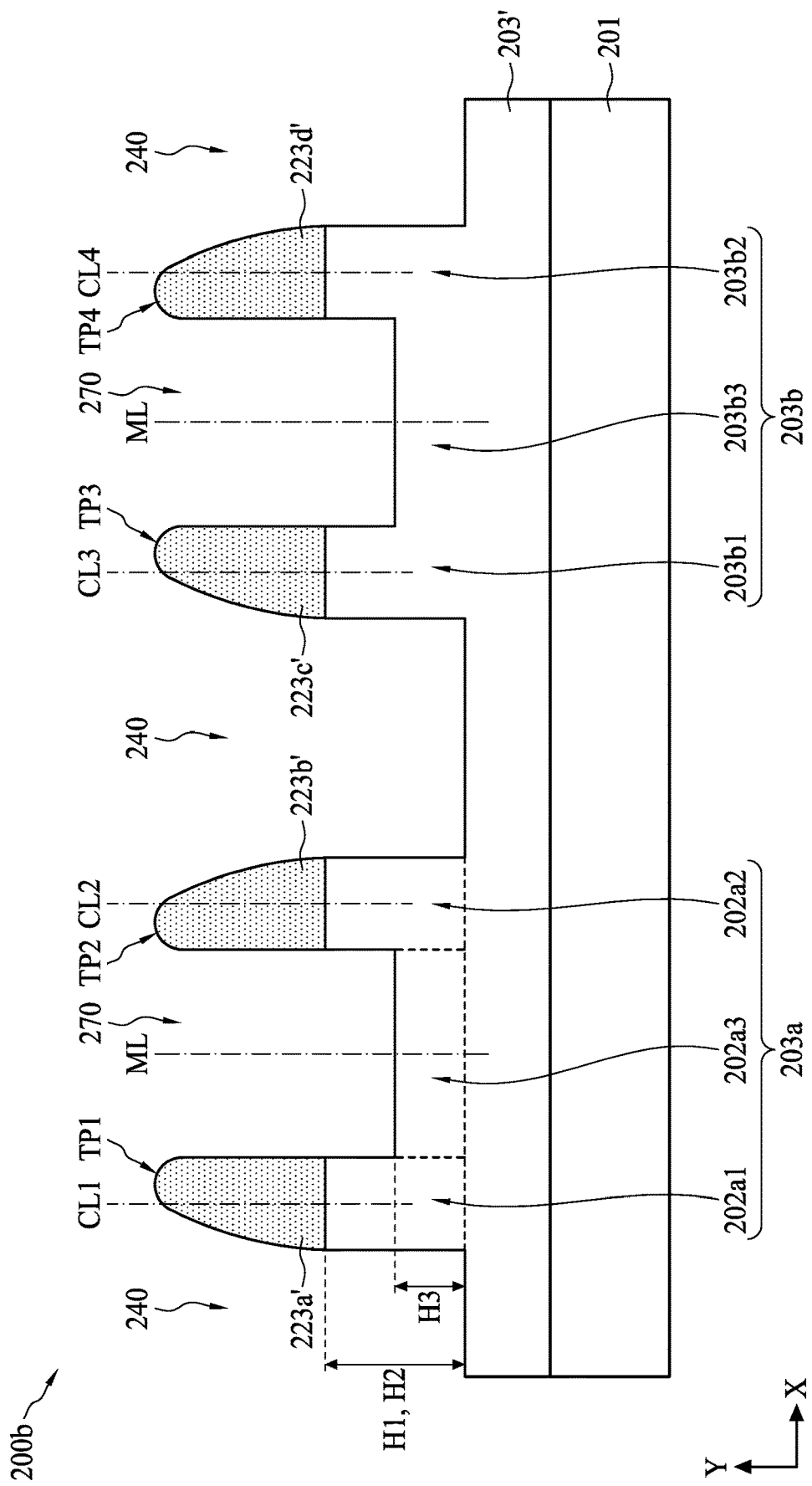
FIG. 3 is a cross-sectional view illustrating a semiconductor device structure, in accordance with some embodiments.

FIG. 3 is a cross-sectional view illustrating a semiconductor device structure 200b, which is an alternative embodiment of the semiconductor device structure 200a, in accordance with some embodiments. For consistency and clarity, similar components appearing in both FIGS. 2 and 3 are labeled the same. One difference between the embodiment shown in FIG. 2 and the embodiment shown in FIG. 3 is that the hard mask structures 205a1, 205a2, 205b1 and 205b2 are not formed in the embodiment shown in FIG. 3.

Figure 4:
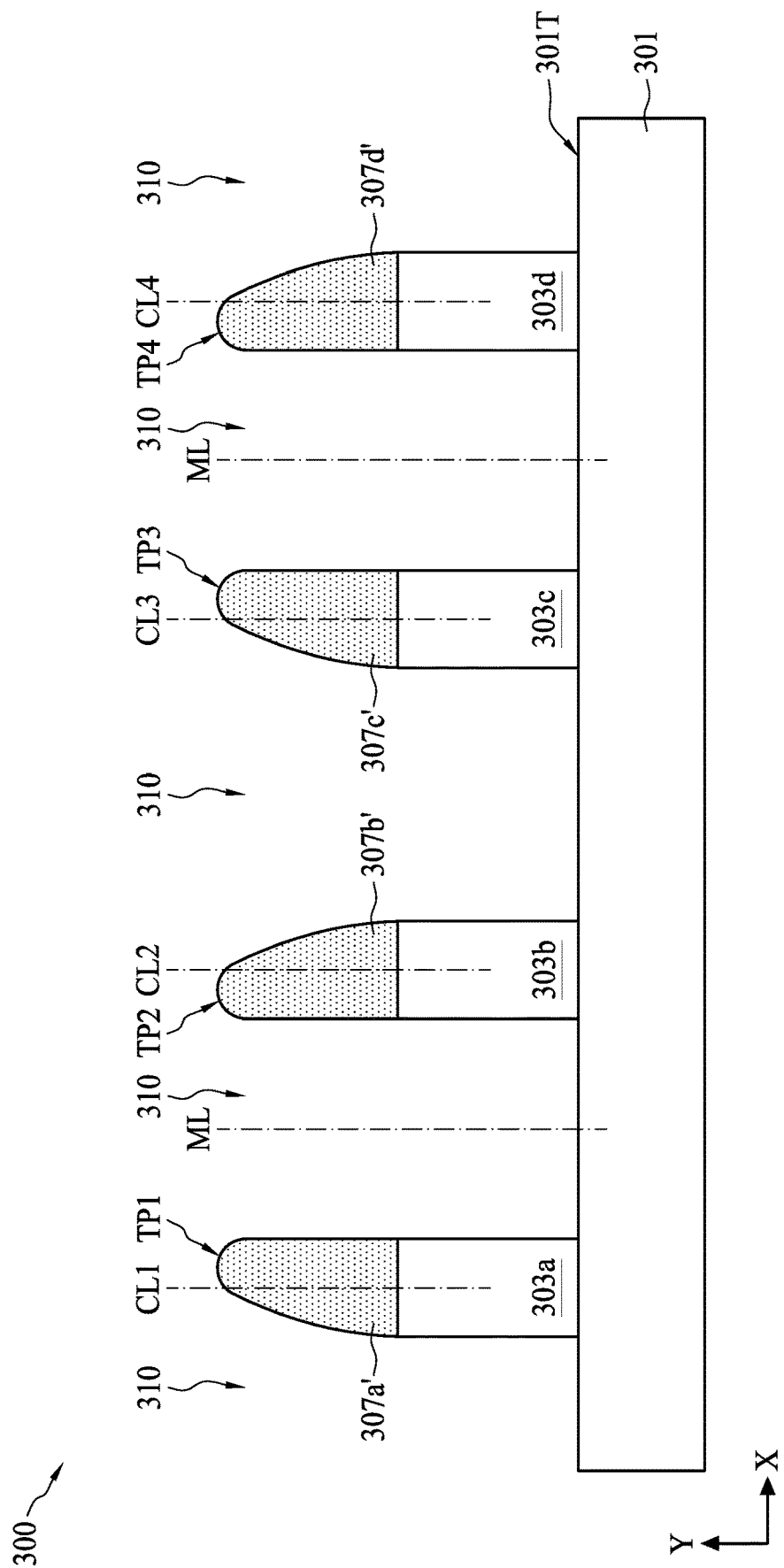

FIG. 4 is a cross-sectional view illustrating a semiconductor device structure 300, in accordance with some embodiments. As shown in FIG. 4, the semiconductor device structure 300 includes target structures 303a, 303b, 303c and 303d disposed over a semiconductor substrate 301, and boron nitride spacers 307a', 307b', 307c' and 307d' disposed over the target structures 303a, 303b, 303c and 303d, in accordance with some embodiments.

In some embodiments, the boron nitride spacer 307a' is disposed over the target structure 303a, the boron nitride spacer 307b' is disposed over the target structure 303b, the boron nitride spacer 307c' is disposed over the target structure 303c, and the boron nitride spacer 307d' is disposed over the target structure 303*d*. Moreover, in some embodiments, each adjacent pair of the boron nitride spacers 307*a'*, 307*b'*, 307*c'* and 307*d'* is separated by an opening 310. In some embodiments, each adjacent pair of the adjacent target structures 303*a*, 303*b*, 303*c* and 303*d* is separated by one of the openings 310 such that a top surface 301T of the semiconductor substrate 301 is exposed in the opening 310.

As shown in FIG. 4, the target structure 303*a* has a central line CL1, the target structure 303*b* has a central line CL2, the target structure 303*c* has a central line CL3, and the target structure 303*d* has a central line CL4. Moreover, the boron nitride spacer 307*a'* has a topmost point TP1, the boron nitride spacer 307*b'* has a topmost point TP2, the boron nitride spacer 307*c'* has a topmost point TP3, and the boron nitride spacer 307*d'* has a topmost point TP4.

In some embodiments, as shown in FIG. 4, the topmost point TP1 of the boron nitride spacer 307*a'* and the topmost point TP2 of the boron nitride spacer 307*b'* are between the central line CL1 and the central line CL2, and the topmost point TP3 of the boron nitride spacer 307*c'* and the topmost point TP4 of the boron nitride spacer 307*d'* are between the central line CL3 and the central line CL4, in accordance with some embodiments.

Figure 5:
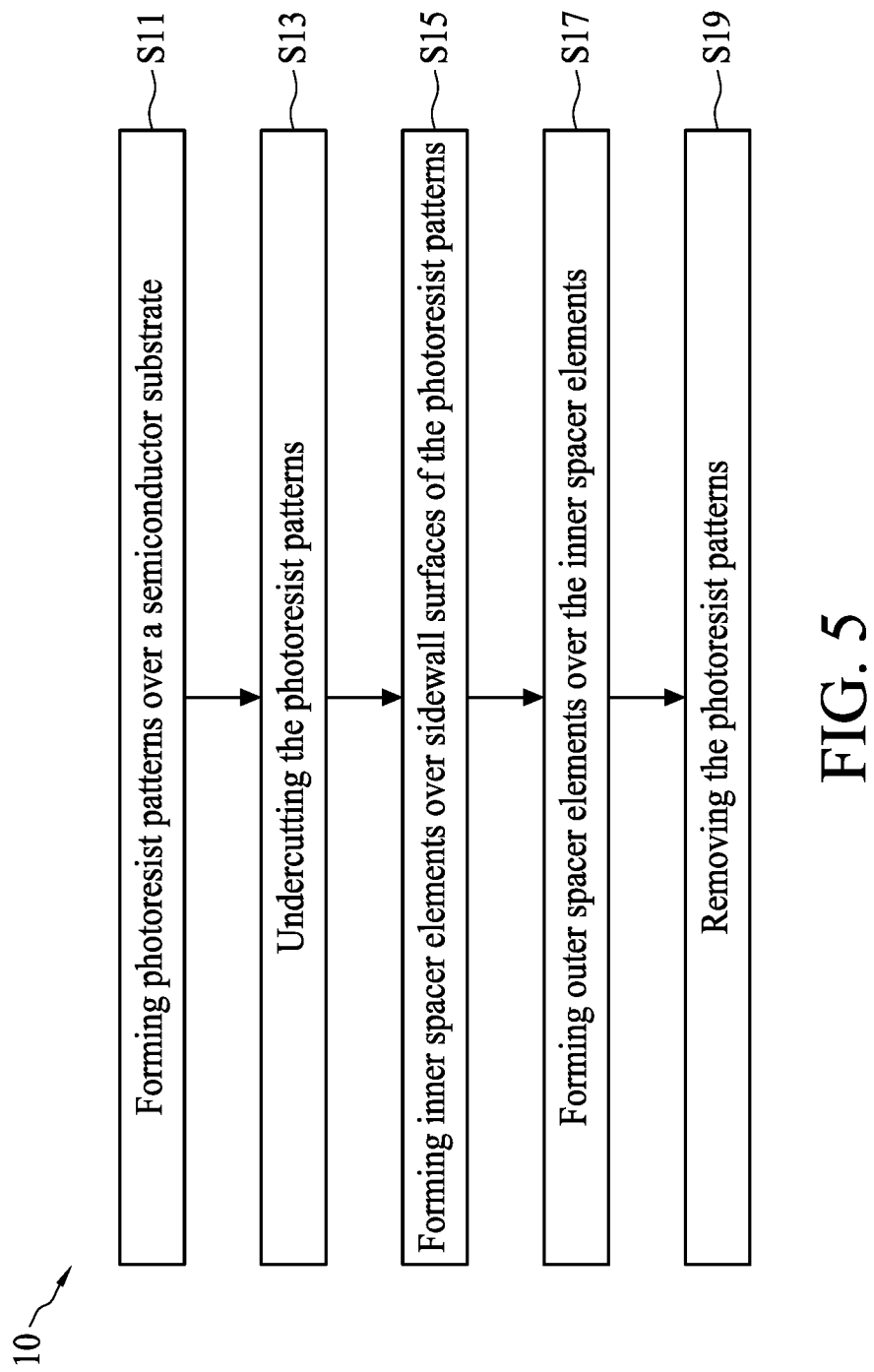
FIG. 5 is a flow diagram illustrating a method of forming a semiconductor device structure, in accordance with some embodiments.

FIG. 5 is a flow diagram illustrating a method 10 of forming the semiconductor device structure 100, wherein the method 10 includes steps S11, S13, S15, S17 and S19, in accordance with some embodiments. The steps S11 to S19 of FIG. 5 are elaborated in connection with FIGS. 8, 9, 10 and 1, which are cross-sectional views illustrating sequential intermediate stages in the formation of the semiconductor device structure 100, in accordance with some embodiments.

Figure 8:
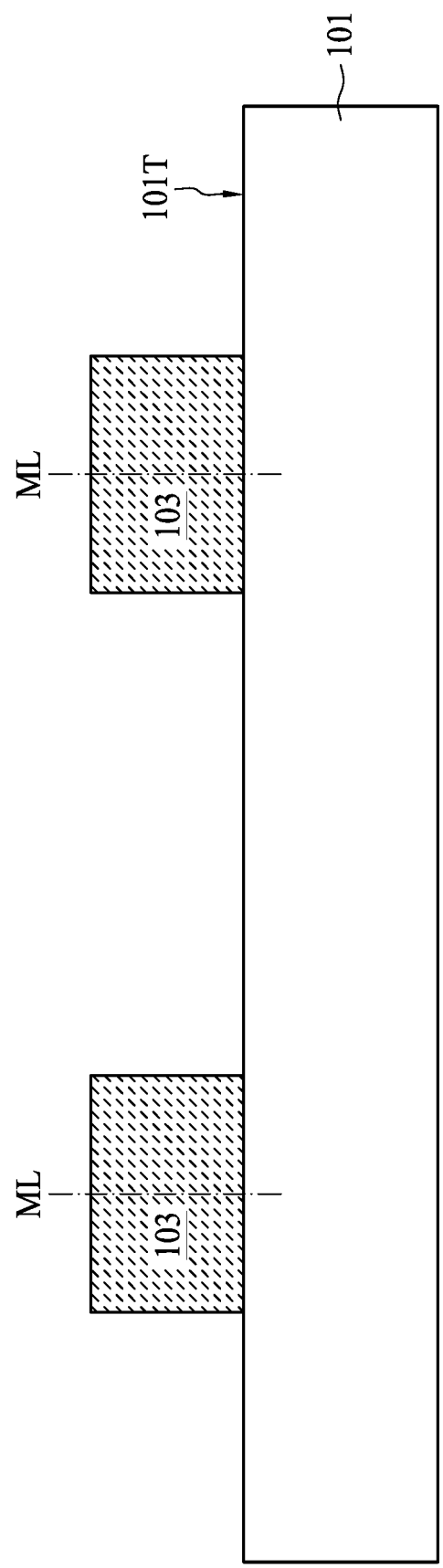
FIG. 8 is a cross-sectional view illustrating an intermediate stage in the formation of photoresist patterns of a semiconductor device structure, in accordance with some embodiments.

As shown in FIG. 8, the semiconductor substrate 101 is provided. The semiconductor substrate 101 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

In some embodiments, photoresist patterns 103 are disposed over the top surface 101T of the semiconductor substrate 101. The respective step is illustrated as the step S11 in the method 10 shown in FIG. 5. In some embodiments, the photoresist patterns 103 may be formed by a deposition process and a patterning process.

The deposition process for forming the photoresist patterns 103 may include a chemical vapor deposition (CVD) process, a high-density plasma chemical vapor deposition (HDPCVD) process, a spin-on process, or another suitable process. The patterning process for forming the photoresist patterns 103 may include a photolithography process. The photolithography process may include photoresist coating (e.g., spin-on coating), soft baking, mask aligning, exposure, post-exposure baking, developing the photoresist, rinsing and drying (e.g., hard baking).

Figure 9:
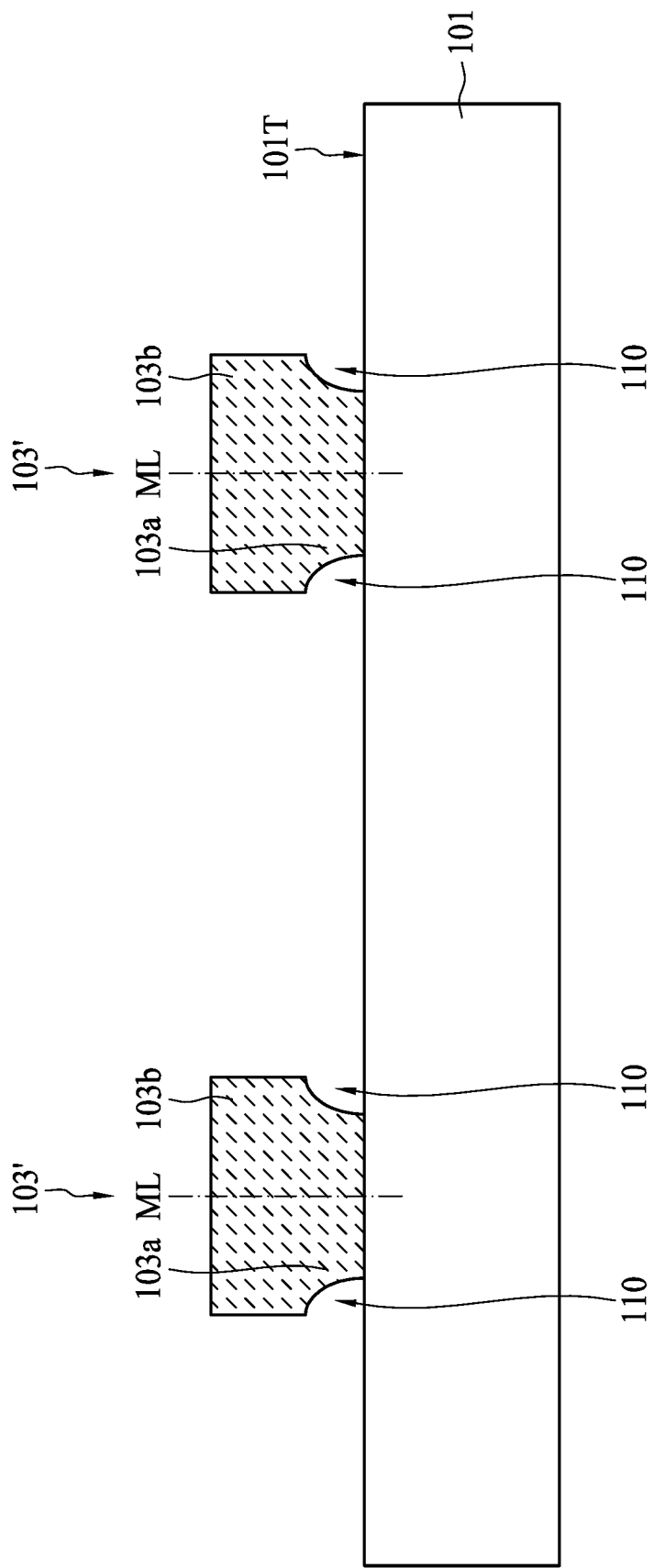
FIG. 9 is a cross-sectional view illustrating an intermediate stage in the formation of undercutting the photoresist patterns, in accordance with some embodiments.

Next, a wet etching process is performed on the photoresist patterns 103, as shown in FIG. 9 in accordance with some embodiments. It should be noted that the wet etching process undercuts the upper portions 103*b* of the etched photoresist patterns 103' and forms undercut portions 110 within the lower portions 103*a* of the etched photoresist patterns 103', in accordance with some embodiments. The respective step is illustrated as the step S13 in the method 10 shown in FIG. 5.

Figure 10:
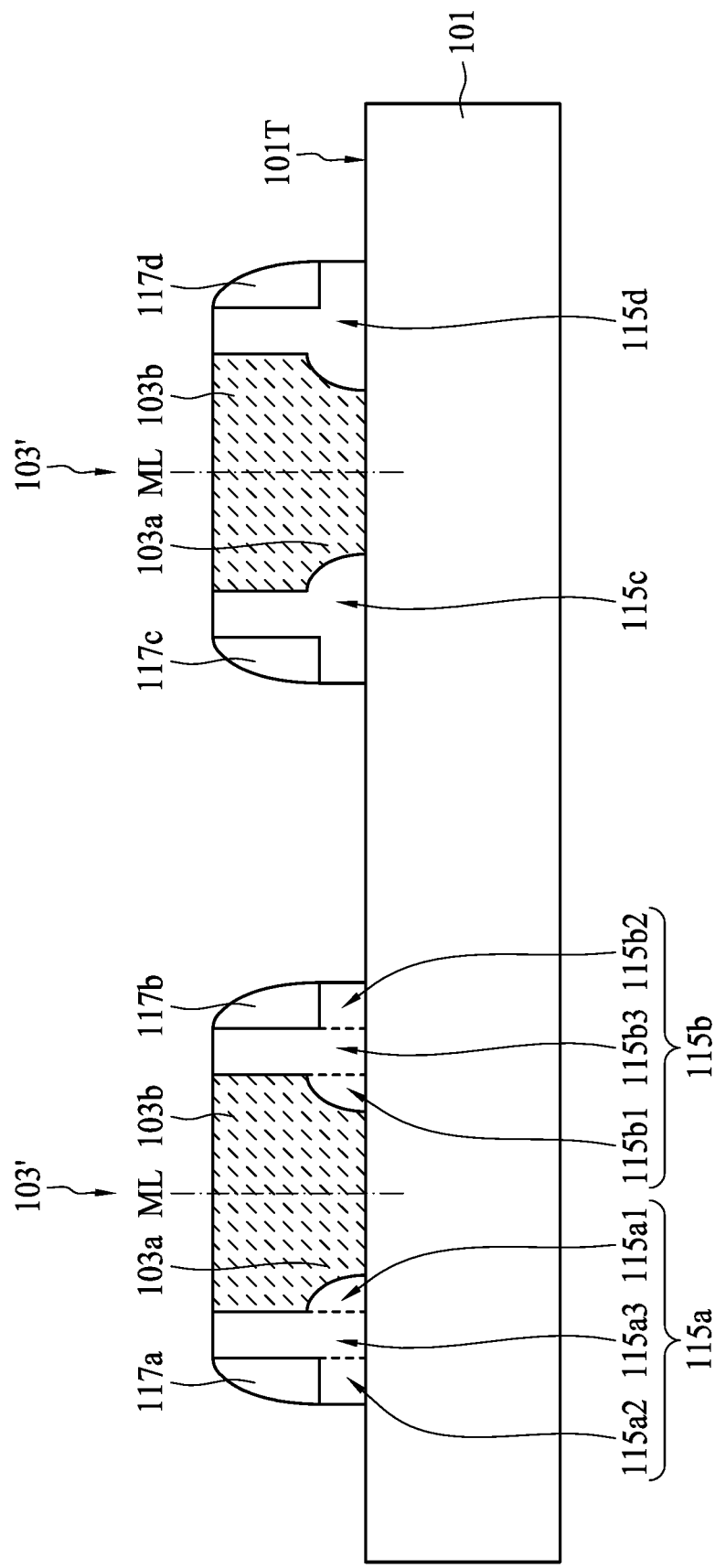
FIG. 10 is a cross-sectional view illustrating an intermediate stage in the formation of inner spacers and outer spacers, in accordance with some embodiments.

After the wet etching process, inner spacer elements 115*a*, 115*b*, 115*c*, 115*d* are disposed over sidewall surfaces of the etched photoresist patterns 103', and outer spacer elements 117*a*, 117*b*, 117*c*, 117*d* are disposed over the inner spacer elements 115*a*, 115*b*, 115*c*, 115*d*, as shown in FIG. 10 in accordance with some embodiments. The respective step is illustrated as the steps S15 and S17 in the method 10 shown in FIG. 5.

In some embodiments, the inner spacer elements 115*a*, 115*b*, 115*c*, 115*d* and the outer spacer elements 117*a*, 117*b*, 117*c*, 117*d* are made of dielectric materials, such as silicon oxide, silicon carbide, silicon nitride, silicon oxynitride, one or more suitable dielectric materials, or a combination thereof. In some embodiments, the inner spacer elements 115*a*, 115*b*, 115*c*, 115*d* are stress-extension films, and the outer spacer elements 117*a*, 117*b*, 117*c*, 117*d* are stress-compression films. In some other embodiments, the inner spacer elements 115*a*, 115*b*, 115*c*, 115*d* are stress-compression films, and the outer spacer elements 117*a*, 117*b*, 117*c*, 117*d* are stress-extension films.

In some embodiments, the inner spacer elements 115*a*, 115*b*, 115*c*, 115*d* are formed by a deposition process and an etching process. For example, an inner spacer material (not shown) may be conformally deposited over the top surfaces and the sidewall surfaces of the etched photoresist patterns 103' and the top surface 101T of the semiconductor substrate 101, and a portion of the inner spacer material may be deposited into the undercut portions 110 (see FIG. 9). Next, the inner spacer material is partially removed by an etching process, leaving the inner spacer elements 115*a*, 115*b*, 115*c*, 115*d*, as shown in FIG. 10 in accordance with some embodiments. In some embodiments, the etching process includes a dry etching process.

Next, the outer spacer elements 117*a*, 117*b*, 117*c*, 117*d* are formed by a deposition process and an etching process. For example, an outer spacer material (not shown) may be conformally deposited over the top surfaces of the etched photoresist patterns 103', the top surfaces and the sidewall surfaces of the inner spacer elements 115*a*, 115*b*, 115*c*, 115*d*, and the top surface 101T of the semiconductor substrate 101. Next, the outer spacer material is partially removed by an etching process, leaving the outer spacer elements 117*a*, 117*b*, 117*c*, 117*d*, as shown in FIG. 10 in accordance with some embodiments. In some embodiments, the etching process includes a dry etching process.

In some embodiments, in the fabrication of the outer spacer elements 117*a*, 117*b*, 117*c*, 117*d* made of boron nitride, the device is placed in a reaction chamber and is preferably heated to a temperature between 100 degrees Celsius and 500 degrees Celsius at a chamber pressure between 0.5 Torr and 10 Torr. More preferably, the temperature is between 300 degrees Celsius and 400 degrees Celsius, and the chamber pressure is between 0.5 Torr and 3 Torr.

In some embodiments, a boron precursor gas, such as one or more of boron trichloride (BCl$_3$), trimethylboron (B(CH$_3$)$_3$), diborane (B$_2$H$_6$), boron tribromide (BBr$_3$), or a precursor gas diluted with an inert gas such as helium (He) or argon (Ar), is then pulsed into the chamber where it is allowed to form a monolayer, or less than a monolayer, on the exposed surfaces of the device (i.e., surfaces of the gate stack, hardmask, semiconductor body, and, if present, the liner layer). In some embodiments, the boron precursor is pulsed for a time period between 2 seconds to 30 seconds at a flow rate ranging from 50 standard cubic centimeters (sccm) per minute to 1,000 sccm per minute. In some embodiments, the flow rate at which the boron precursor is pulsed into the chamber is between 100 sccm per minute and 500 sccm per minute.

In some embodiments, after the boron precursor is pulsed into the chamber, the chamber is purged with an inert gas, such as nitrogen (N2), argon (Ar), or helium (He), for an amount of time (e.g., 30 seconds) necessary to remove byproducts and all unreacted species from the chamber.

In some embodiments, a nitrogen-containing reactant gas, such as nitrogen, ammonia (NH$_3$), or a mixture of nitrogen and hydrogen (H$_2$), is then pulsed into the deposition chamber to react with the first layer and form a monolayer of boron-nitrogen. In some embodiments, the nitrogen-containing gas is pulsed into the chamber for a time period between 1 second and 10 seconds at a flow rate between 50 sccm per minute and 1,000 sccm per minute. In some embodiments, the flow rate at which the nitrogen-containing gas is pulsed is between 100 sccm per minute and 300 sccm per minute.

In some embodiments, PEALD techniques may also be used when providing the nitrogen-containing reactant gas to the chamber, whereby the boron-nitrogen bond forming reactions are assisted by dissociating the reactant gases using a plasma. In some embodiments, where PEALD is used, the plasma condition is created at a power between 50 W to 500 W and, more preferably, at a power between 100 W and 200 W.

In some embodiments, after pulsing the nitrogen-containing reactant gas, the chamber is again purged for an appropriate amount of time, and the cycle is repeated until deposition of the boron nitride layer has occurred to the desired thickness.

As mentioned above, the inner spacer element 115a includes the first portion 115a1, the second portion 115a2 and the third portion 115a3, and the inner spacer element 115b includes the fourth portion 115b1, the fifth portion 115b2 and the sixth portion 115b3. In some embodiments, the first portion 115a1 and the fourth portion 115b1 are covered by the upper portion 103b of the etched photoresist pattern 103', and the second portion 115a2 and the fifth portion 115b2 are covered by the outer spacer elements 117a and 117b, respectively.

In some embodiments, the interface between the first portion 115a1 and the etched photoresist pattern 103' has a convex profile facing the etched photoresist pattern 103', and the first portion 115a1 is enclosed by the third portion 115a3, the etched photoresist pattern 103' and the semiconductor substrate 101. Similarly, in some embodiments, the interface between the fourth portion 115b1 and the etched photoresist pattern 103' has a convex profile facing the etched photoresist pattern 103', and the fourth portion 115b1 is enclosed by the sixth portion 115b3, the etched photoresist pattern 103' and the semiconductor substrate 101. It should be noted that the right half of the structure may have features similar to those of the left half of the structure.

After the outer spacer elements 117a, 117b, 117c, 117d are formed, the etched photoresist patterns 103' are removed, as shown in FIG. 1 in accordance with some embodiments. The respective step is illustrated as the step S19 in the method 10 shown in FIG. 5. The etched photoresist patterns 103' may be removed by an etching process, such as a dry etching process, a wet etching process, or a combination thereof. After the etched photoresist patterns 103' are removed, openings 150 are obtained, and the first portion 115a1 and the fourth portion 115b1 are exposed by one of the openings 150. In some embodiments, the semiconductor device structure 100 includes a film structure (not shown in the drawings) over the semiconductor substrate 101. In some embodiments, the inner spacer elements 115a, 115b, 115c and 115d are formed over the film structure, serving as hard mask of fine patterns, which can be used in the subsequent fabrication process for patterning corresponding fine patterns in the film structure.

Since the inner spacer elements 115a, 115b, 115c and 115d have portions extending into the undercut portions 110 (see FIG. 9) to form footings, the base width (along the X-direction) of each of the inner spacer elements 115a, 115b, 115c and 115d is increased. As a result, the inner spacer elements 115a, 115b, 115c and 115d may be prevented from collapsing during the subsequent fabrication process, serving as hard mask for patterning the film structure, even the etched photoresist pattern 103' is removed. Moreover, the formation of the outer spacer elements 117a, 117b, 117c and 117d may help the semiconductor device structure 100 to better resist the harmful effects of subsequent etching process, such as a dry etching process.

Figure 6:
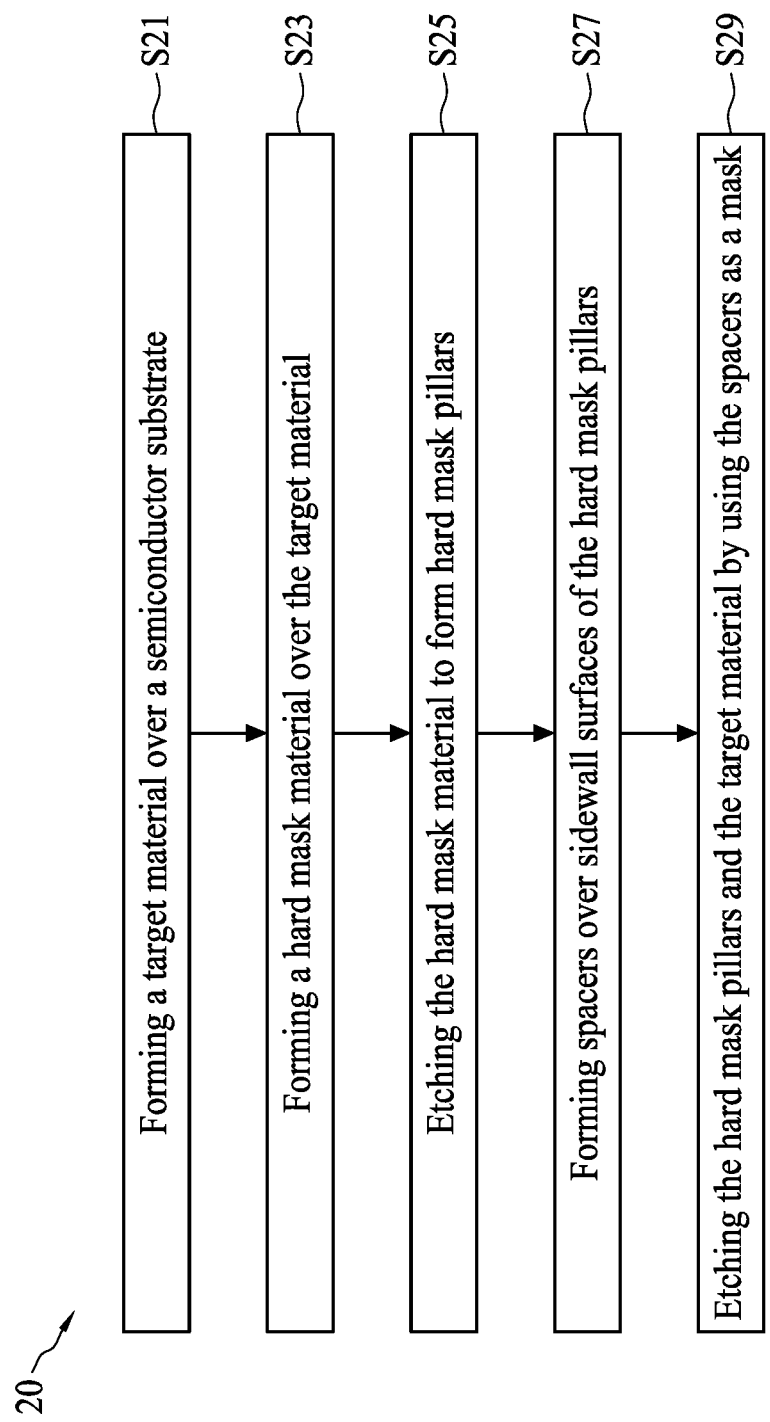
FIG. 6 is a flow diagram illustrating a method of forming a semiconductor device structure, in accordance with some embodiments.

FIG. 6 is a flow diagram illustrating a method 20 of forming a semiconductor device structure (e.g., the semiconductor device structure 200a or 200b), wherein the method 20 includes steps S21, S23, S25, S27 and S29, in accordance with some embodiments.

In accordance with some embodiments, the steps S21 to S29 of FIG. 6 are elaborated in connection with FIGS. 11, 12, 13 and 2, which are cross-sectional views illustrating sequential intermediate stages in the formation of the semiconductor device structure 200a. In accordance with some other embodiments, the steps S21 to S29 of FIG. 6 are elaborated in connection with FIGS. 14, 15, 16 and 3, which are cross-sectional views illustrating sequential intermediate stages in the formation of the semiconductor device structure 200b.

Figure 11:
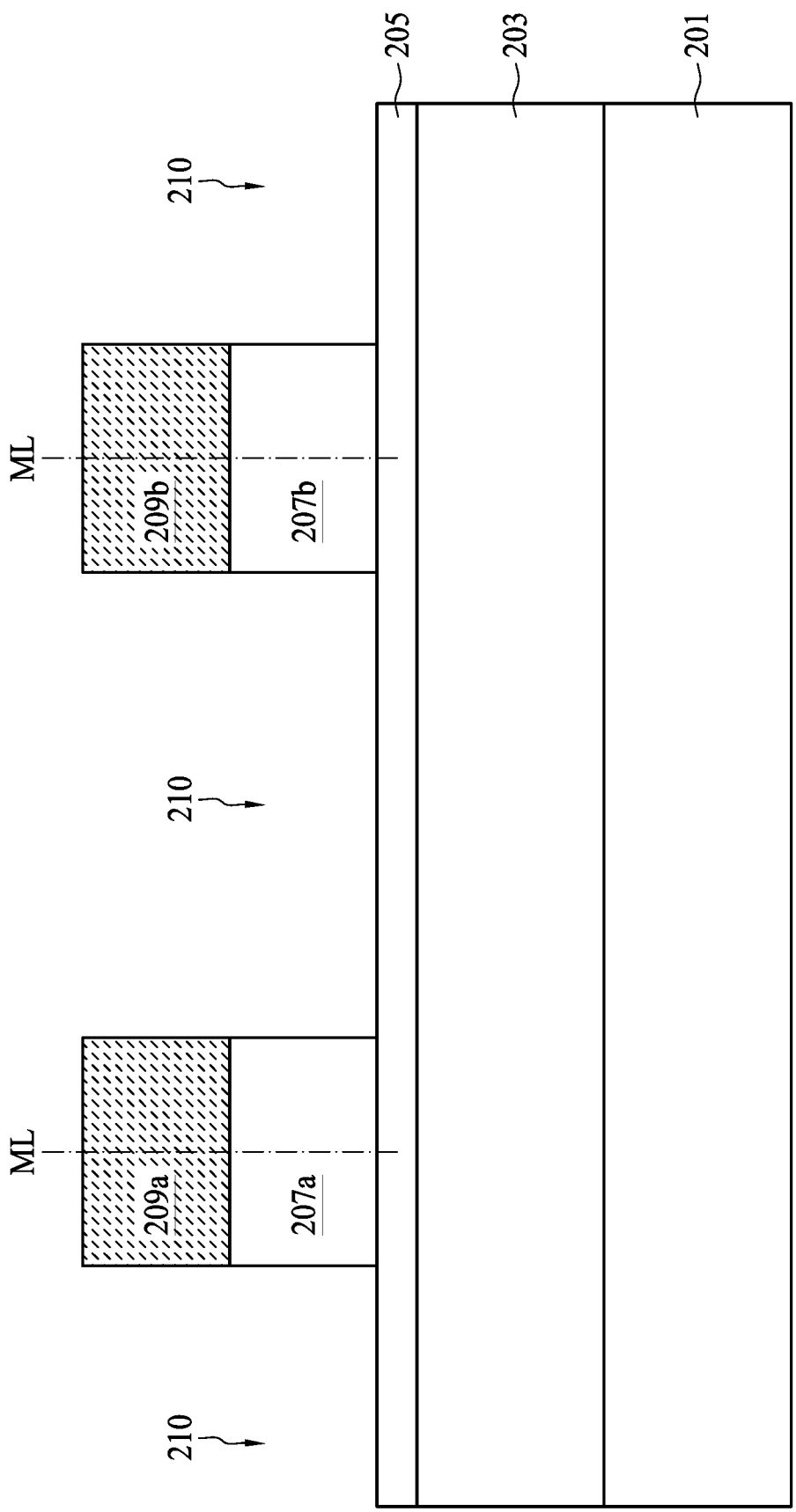
FIG. 11 is a cross-sectional view illustrating an intermediate stage in the formation of hard mask pillars and photoresist patterns over a semiconductor device structure, in accordance with some embodiments.

As shown in FIG. 11, the semiconductor substrate 201 is provided, and a target material 203 is disposed over the semiconductor substrate 201. The respective step is illustrated as the step S21 in the method 20 shown in FIG. 6. The details of the semiconductor substrate 201 may be similar to or the same as the details of the semiconductor substrate 101, and descriptions thereof are not repeated herein.

In some embodiments, the target material 203 is a dielectric layer. For example, the target material 203 is made of silicon oxide, silicon carbide, silicon nitride, silicon oxynitride, another suitable dielectric material, or a combination thereof. In some embodiments, the target material 203 includes an interconnect structure, which has one or more metallization layers (e.g., copper layers) formed in the target material 203, and the interconnect structure is used to connect various electrical components to form functional circuitry. In some embodiments, the target material 203 is formed by any suitable process, such as deposition, damascene, and/or dual damascene.

Still referring to FIG. 11, a hard mask layer 205 is disposed over the target material 203 and hard mask pillars 207a and 207b are disposed over the hard mask layer 205 by an etching process using photoresist patterns 209a and 209b as a mask, in accordance with some embodiments. In some embodiments, the hard mask layer 205 and the hard mask pillars 207a, 207b are made of dielectric materials, such as silicon oxide, silicon carbide, silicon nitride, silicon oxynitride, one or more suitable materials, or a combination thereof.

Specifically, the hard mask layer 205 and the hard mask pillars 207a, 207b are formed by a deposition process and an etching process, in accordance with some embodiments. For example, a hard mask material (not shown) may be conformally deposited over the top surface of the target layer 203, and the photoresist patterns 209a and 209b are disposed over the hard mask material. Some processes used to form the photoresist patterns 209a and 209b are similar to, or the same as, those used to form the photoresist patterns 103 and descriptions thereof are not repeated herein. After the photoresist patterns 209a and 209b are formed, portions of the hard mask material exposed by the photoresist patterns 209a and 209b are removed by a dry etching process to form openings 210 between adjacent hard mask pillars (e.g., the hard mask pillars 207a and 207b), as shown in FIG. 11. The respective steps are illustrated as the steps S23 and S25 in the method 20 shown in FIG. 6.

It should be noted that the target material 203 is not exposed by the openings 210, in accordance with some embodiments. Moreover, the hard mask layer 205 and the hard mask pillars 207a, 207b are made of the same material and are formed simultaneously, in accordance with some embodiments. After the openings 210 are obtained, the photoresist patterns 209a and 209b may be removed.

Figure 12:
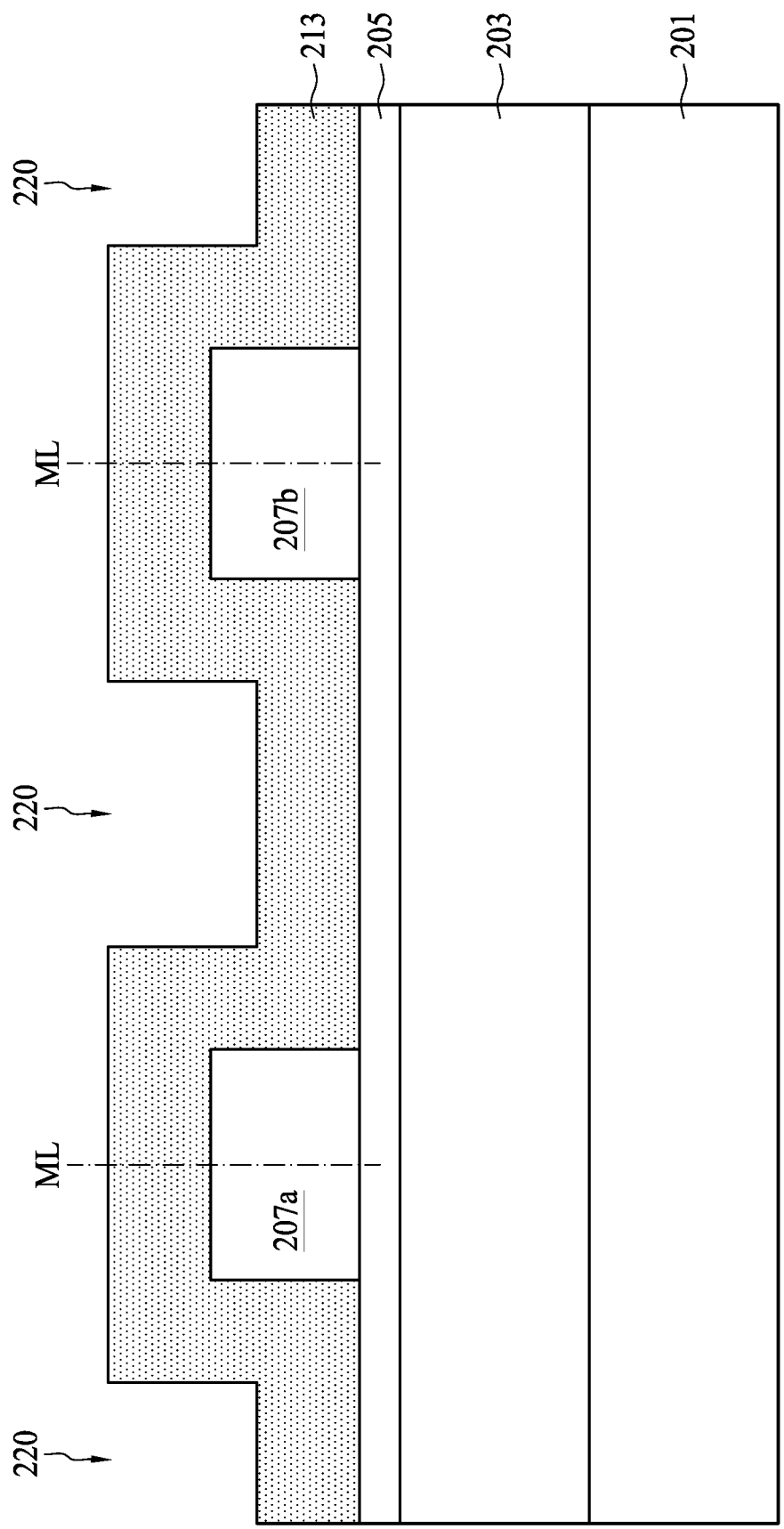
FIG. 12 is a cross-sectional view illustrating an intermediate stage in the formation of a conformal spacer material over the semiconductor device structure, in accordance with some embodiments.

After the photoresist patterns 209a and 209b are removed, a spacer material 213 is conformally deposited over the top surfaces and the sidewall surfaces of the hard mask pillars 207a, 207b and the top surface of the hard mask layer 205, such that reduced openings 220 are obtained, as shown in FIG. 12 in accordance with some embodiments.

In some embodiments, the spacer material 213 is made of boron nitride, and the deposition process for forming the spacer material 213 includes a CVD process, a physical vapor deposition (PVD) process, an atomic layer deposition (ALD) process, a spin-on process, or another suitable process; preferably, using ALD and/or PEALD techniques. In some embodiments, the material of the spacer material 213 is different from the material of the hard mask pillars 207a and 207b. It should be noted that the material of the hard mask pillars 207a and 207b has a high etching selectivity against the material of the spacer material 213.

Figure 13:
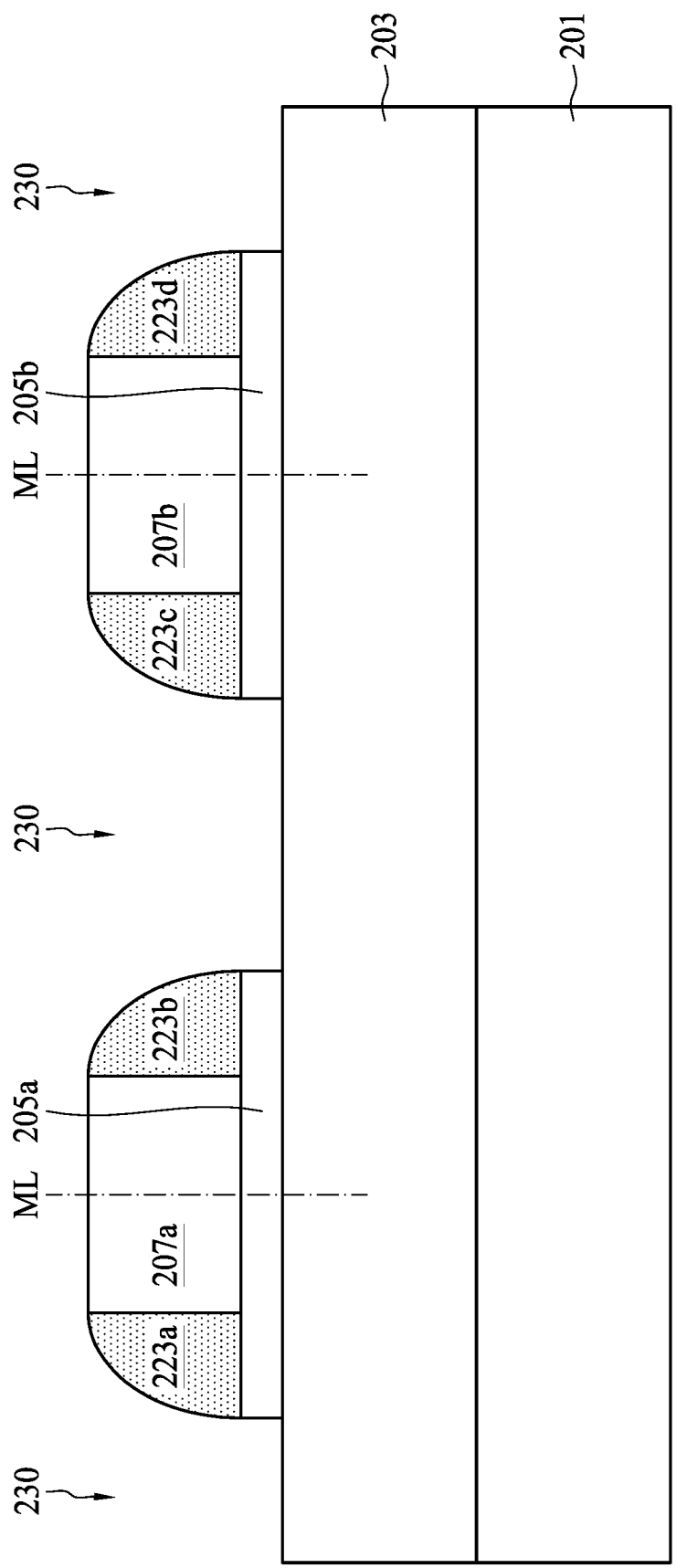
FIG. 13 is a cross-sectional view illustrating an intermediate stage in the formation of a spacer element over the semiconductor device structure, in accordance with some embodiments.

Next, the spacer material 213 is etched to form spacers 223a, 223b, 223c and 223d over sidewall surfaces of the hard mask pillars 207a, 207b, as shown in FIG. 13 in accordance with some embodiments. The respective steps are illustrated as the step S27 in the method 20 shown in FIG. 6. In some embodiments, the etching process is an anisotropic etching process, which removes the same amount of the spacer material 213 vertically in all places, leaving the spacers 223a, 223b, 223c and 223d over the sidewall surfaces of the hard mask pillars 207a and 207b. In some embodiments, the etching process is a dry etching process.

In some embodiments, the device is placed in a reaction chamber and is preferably heated to a temperature between 100 degrees Celsius and 500 degrees Celsius at a chamber pressure between 0.5 Torr and 10 Torr. More preferably, the temperature is between 300 degrees Celsius and 400 degrees Celsius, and the chamber pressure is between 0.5 Torr and 3 Torr.

In some embodiments, a boron precursor gas, such as one or more of boron trichloride ($BCl_3$), trimethylboron ($B(CH_3)_3$), diborane ($B_2H_6$), boron tribromide ($BBr_3$), or a precursor gas diluted with an inert gas such as helium (He) or argon (Ar), is then pulsed into the chamber where it is allowed to form a monolayer, or less than a monolayer, on the exposed surfaces of the device (i.e., surfaces of the gate stack, hardmask, semiconductor body, and, if present, the liner layer). In some embodiments, the boron precursor is pulsed for a time period between 2 seconds to 30 seconds at a flow rate ranging from 50 standard cubic centimeters (sccm) per minute to 1,000 sccm per minute. In some embodiments, the flow rate at which the boron precursor is pulsed into the chamber is between 100 sccm per minute and 500 sccm per minute.

In some embodiments, after the boron precursor is pulsed into the chamber, the chamber is purged with an inert gas, such as nitrogen ($N_2$), argon (Ar), or helium (He), for an amount of time (e.g., 30 seconds) necessary to remove byproducts and all unreacted species from the chamber.

In some embodiments, a nitrogen-containing reactant gas, such as nitrogen, ammonia ($NH_3$), or a mixture of nitrogen and hydrogen ($H_2$), is then pulsed into the deposition chamber to react with the first layer and form a monolayer of boron-nitrogen. In some embodiments, the nitrogen-containing gas is pulsed into the chamber for a time period between 1 second and 10 seconds at a flow rate between 50 sccm per minute and 1,000 sccm per minute. In some embodiments, the flow rate at which the nitrogen-containing gas is pulsed is between 100 sccm per minute and 300 sccm per minute.

In some embodiments, PEALD techniques may also be used when providing the nitrogen-containing reactant gas to the chamber, whereby the boron-nitrogen bond forming reactions are assisted by dissociating the reactant gases using a plasma. In some embodiments, where PEALD is used, the plasma condition is created at a power between 50 W to 500 W and, more preferably, at a power between 100 W and 200 W.

In some embodiments, after pulsing the nitrogen-containing reactant gas, the chamber is again purged for an appropriate amount of time, and the cycle is repeated until deposition of the boron nitride layer has occurred to the desired thickness.

Moreover, portions of the hard mask layer 205 between the hard mask pillars 207a and 207b are removed to form hard mask portions 205a and 205b, and openings 230 are obtained between adjacent hard mask portions (e.g., hard mask portions 205a and 205b), as shown in FIG. 13 in accordance with some embodiments. In some embodiments, the target material 203 is exposed by the openings 230. In some embodiments, the spacers 223a, 223b, 223c and 223d are separated from the target material 203 by the hard mask portions 205a and 205b.

Next, the hard mask pillars 207a, 207b, the hard mask portions 205a, 205b, and the target material 203 are etched using the spacers 223a, 223b, 223c, 223d as a mask, as shown in FIG. 2 in accordance with some embodiments. The respective steps are illustrated as the step S29 in the method 20 shown in FIG. 6. In some embodiments, the etching process is a dry etching process.

More specifically, in some embodiments, the hard mask pillars 207a, 207b are entirely removed, the hard mask structures 205a1, 205a2, 205b1 and 205b2 are formed by etching the hard mask portions 205a, 205b and the target layer 203', and the target structures 203a, 203b are disposed over the target layer 203' by etching the target material 203, in accordance with some embodiments. In addition, the spacers 223a, 223b, 223c and 223d are slightly etched to form boron nitride spacers 223a', 223b', 223c' and 223d'. It should be noted that the material of the hard mask pillars 207a, 207b has a high etching selectivity against the material of the spacers 223a, 223b, 223c, 223d (i.e., the material of the boron nitride spacers 223a', 223b', 223c' and 223d') during the etching process.

The material of the hard mask pillars 207a, 207b has a first etching selectivity against the material of the spacers 223a, 223b, 223c, 223d; the material of the hard mask portions 205a, 205b has a second etching selectivity against the material of the spacers 223a, 223b 223c, 223d; and the material of the target material 203 has a third etching selectivity against the material of the spacers 223a, 223b, 223c, 223d. In some embodiments, the first etching selectivity, the second etching selectivity and the third etching selectivity are similar to each other.

Since the top surfaces of the hard mask pillars 207a, 207b are higher than the top surface of the target material 203 before the etching process, the opening 240 is deeper than the openings 270 after the etching process, in accordance with some embodiments. As a result, the boron nitride spacers 223a', 223b', 223c' and 223d' may be prevented from collapsing due to the support provided by the underlying target structures 203a and 203b, which are U-shaped structures protruding from the target layer 203'.

Moreover, because the hard mask pillars 207a, 207b, the hard mask portions 205a, 205b, and the target material 203 have high etching selectivities against the spacers 223a, 223b, 223c, 223d in the etching process for forming the boron nitride spacers 223a', 223b', 223c', 223d', the boron nitride spacers 223a', 223b', 223c', 223d' may be prevented from collapsing.

FIGS. 14, 15, 16 and 3 are cross-sectional views illustrating sequential intermediate stages in the formation of the semiconductor device structure 200b. The semiconductor device structure 200b is similar to, or the same as, the semiconductor device structure 200a, except that the hard mask structures 205a1, 205a2, 205b1 and 205b2 are not formed between the boron nitride spacers 223a', 223b', 223c', 223d' and the target structures 203a, 203b.

Figure 14:
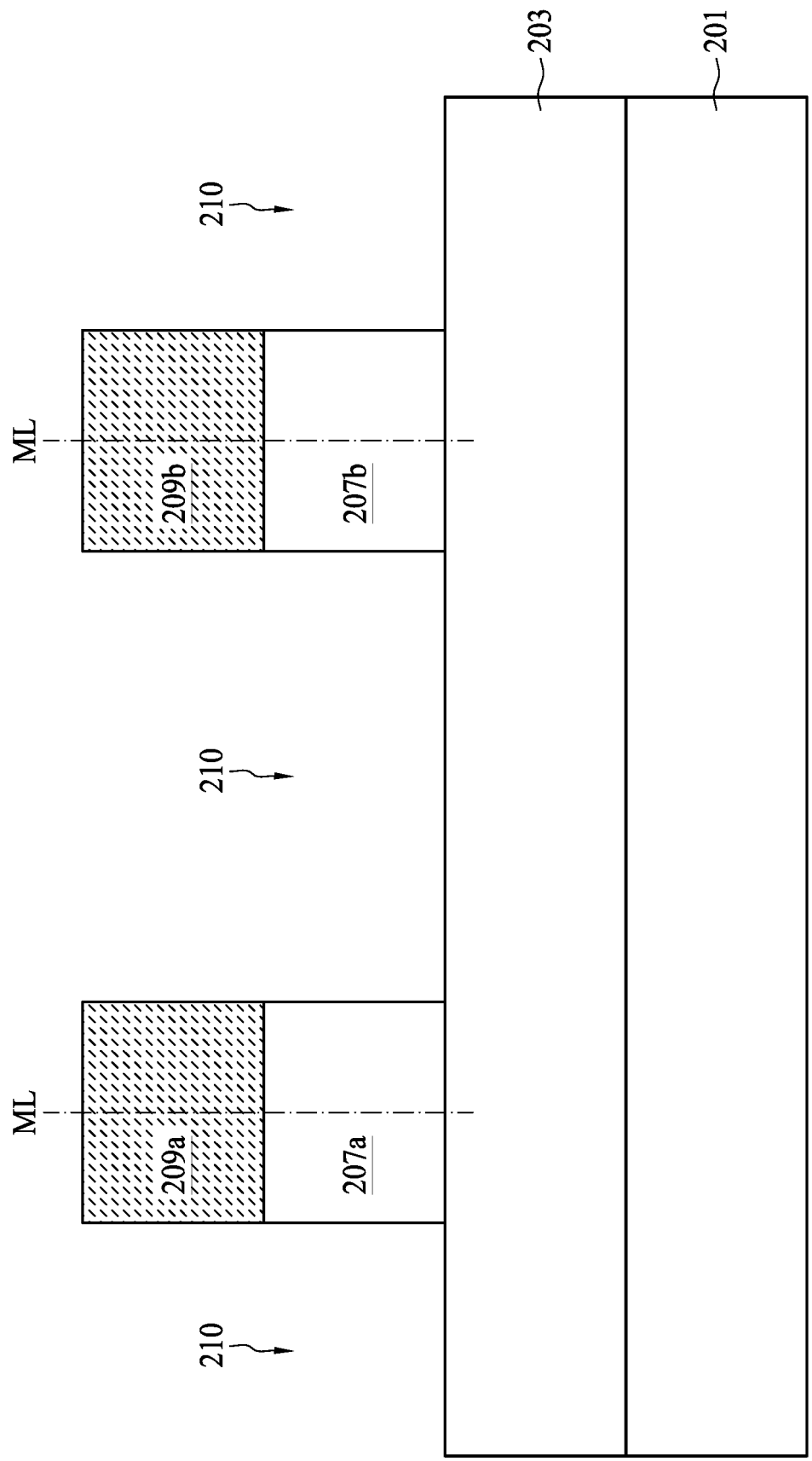
FIG. 14 is a cross-sectional view illustrating an intermediate stage in the formation of hard mask pillars and photoresist patterns over a semiconductor device structure, in accordance with some embodiments.

As shown in FIG. 14, the target material 203 is disposed over the semiconductor substrate 201, and the hard mask pillars 207a and 207b are disposed over the target material 203 by an etching process using the photoresist patterns 209a and 209b as a mask, in accordance with some embodiments. The respective step is illustrated as the steps S21, S23 and S25 in the method 20 shown in FIG. 6. In some embodiments, compared with the structure of FIG. 11, the target material 203 of FIG. 14 is not covered by the hard mask layer 205. More specifically, the hard mask layer 205 is not formed in the structure of FIG. 14, and the target material 203 is exposed by the openings 210, in accordance with some embodiments.

Figure 15:
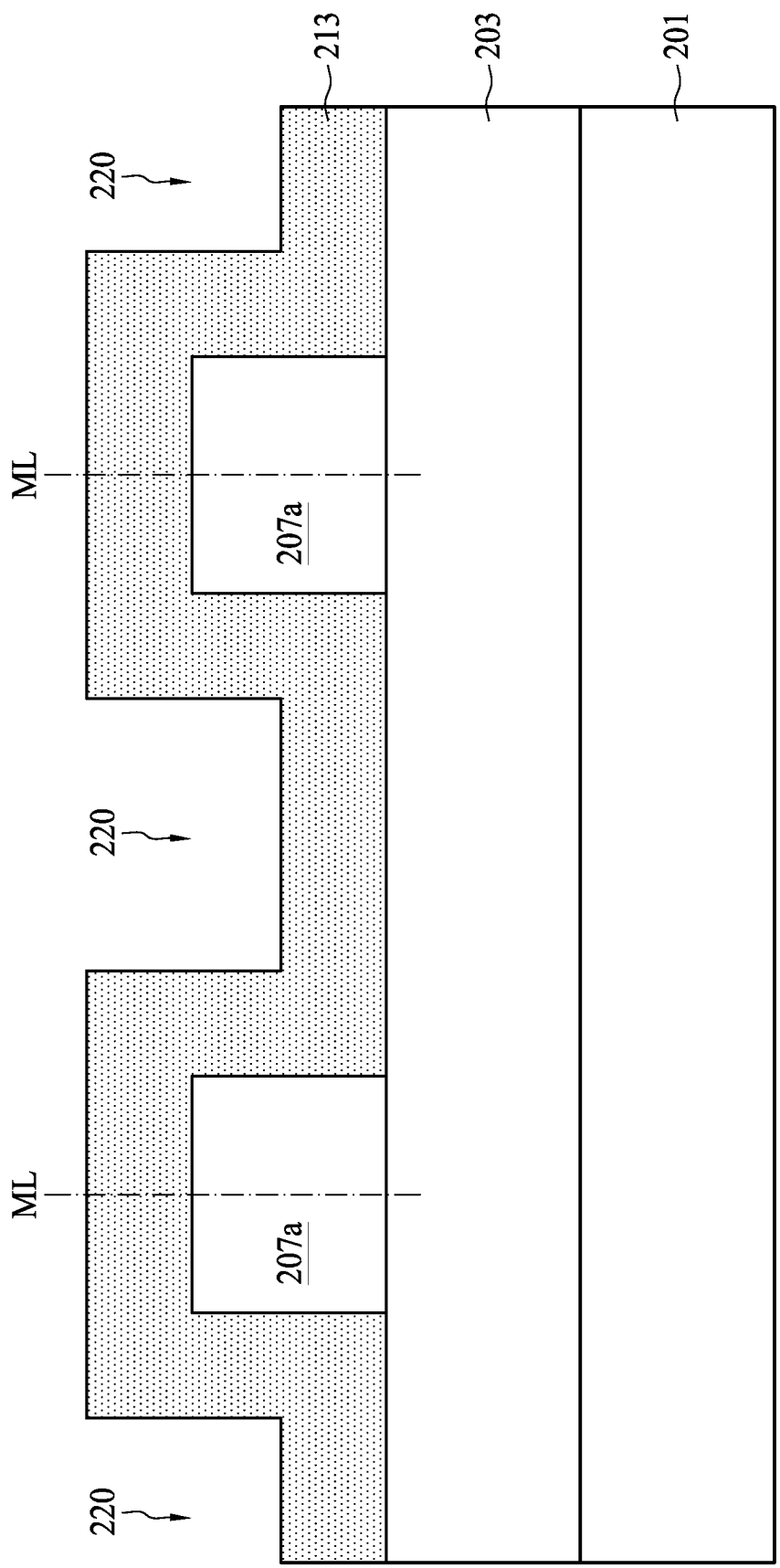
FIG. 15 is a cross-sectional view illustrating an intermediate stage in the formation of a conformal spacer material over the semiconductor device structure, in accordance with some embodiments.

Next, the photoresist patterns 209a and 209b are removed, and the spacer material 213 is conformally deposited over the top surfaces and the sidewall surfaces of the hard mask pillars 207a, 207b and the top surface of the target material 203, such that reduced openings 220 are obtained, as shown in FIG. 15 in accordance with some embodiments.

Figure 16:
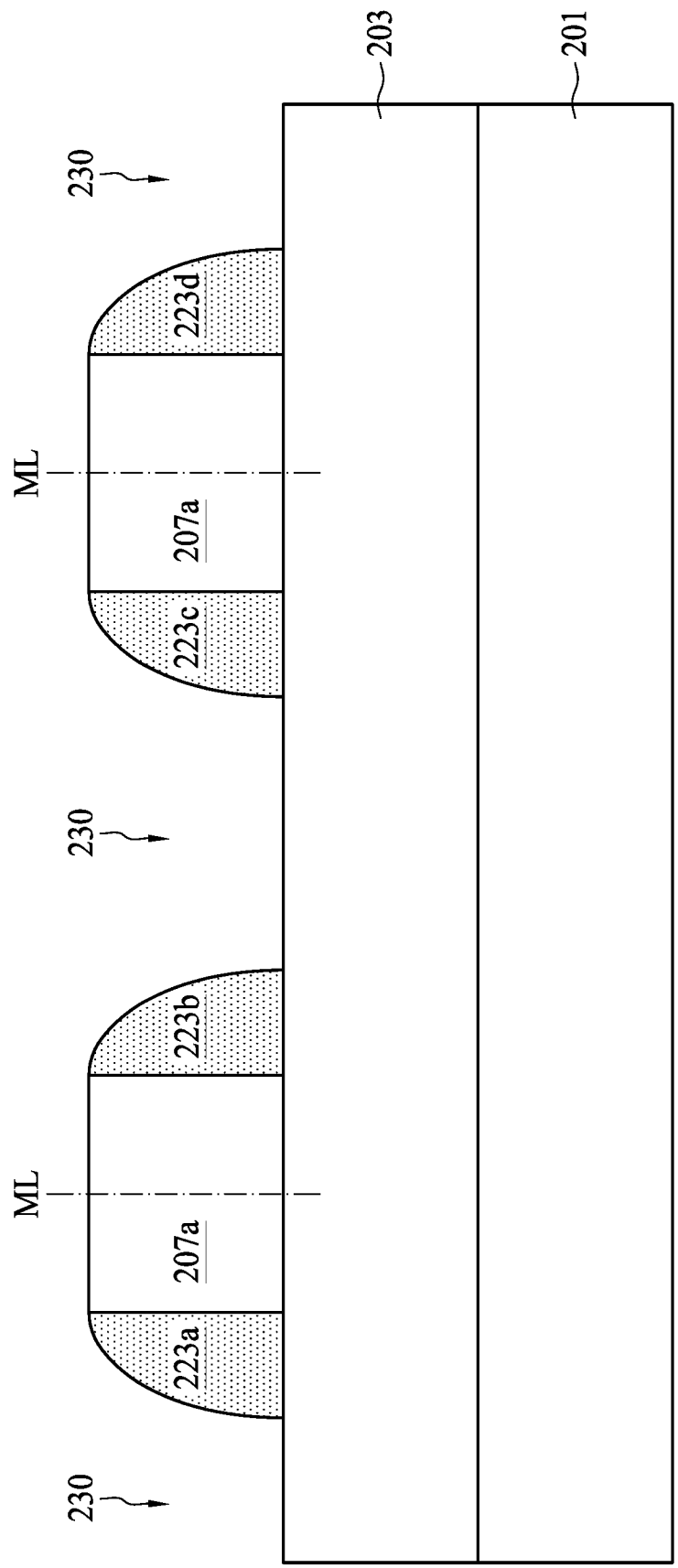
FIG. 16 is a cross-sectional view illustrating an intermediate stage in the formation of a spacer element over the semiconductor device structure, in accordance with some embodiments.

The spacer material 213 is etched to form spacers 223a, 223b, 223c and 223d over sidewall surfaces of the hard mask pillars 207a, 207b, as shown in FIG. 16 in accordance with some embodiments. The respective steps are illustrated as the step S27 in the method 20 shown in FIG. 6. In some embodiments, compared with the structure of FIG. 13, the spacers 223a, 223b, 223c and 223d of FIG. 16 are in direct contact with the target material 203.

Next, the hard mask pillars 207a, 207b and the target material 203 are etched using the spacers 223a, 223b, 223c and 223d as a mask, and the spacers 223a, 223b, 223c and 223d are slightly etched to form boron nitride spacers 223a', 223b', 223c' and 223d', as shown in FIG. 3 in accordance with some embodiments. The respective steps are illustrated as the step S29 in the method 20 shown in FIG. 6.

More specifically, in some embodiments, the hard mask pillars 207a, 207b are entirely removed, and the target layer 203' and the target structures 203a, 203b over the target layer 203' are formed by etching the target material 203 in accordance with some embodiments. As mentioned above, compared with the semiconductor device structure 200a, the boron nitride spacers 223a', 223b', 223c' and 223d' of the semiconductor device structure 200b are in direct contact with the target structures 203a and 203b, in accordance with some embodiments.

Figure 7:
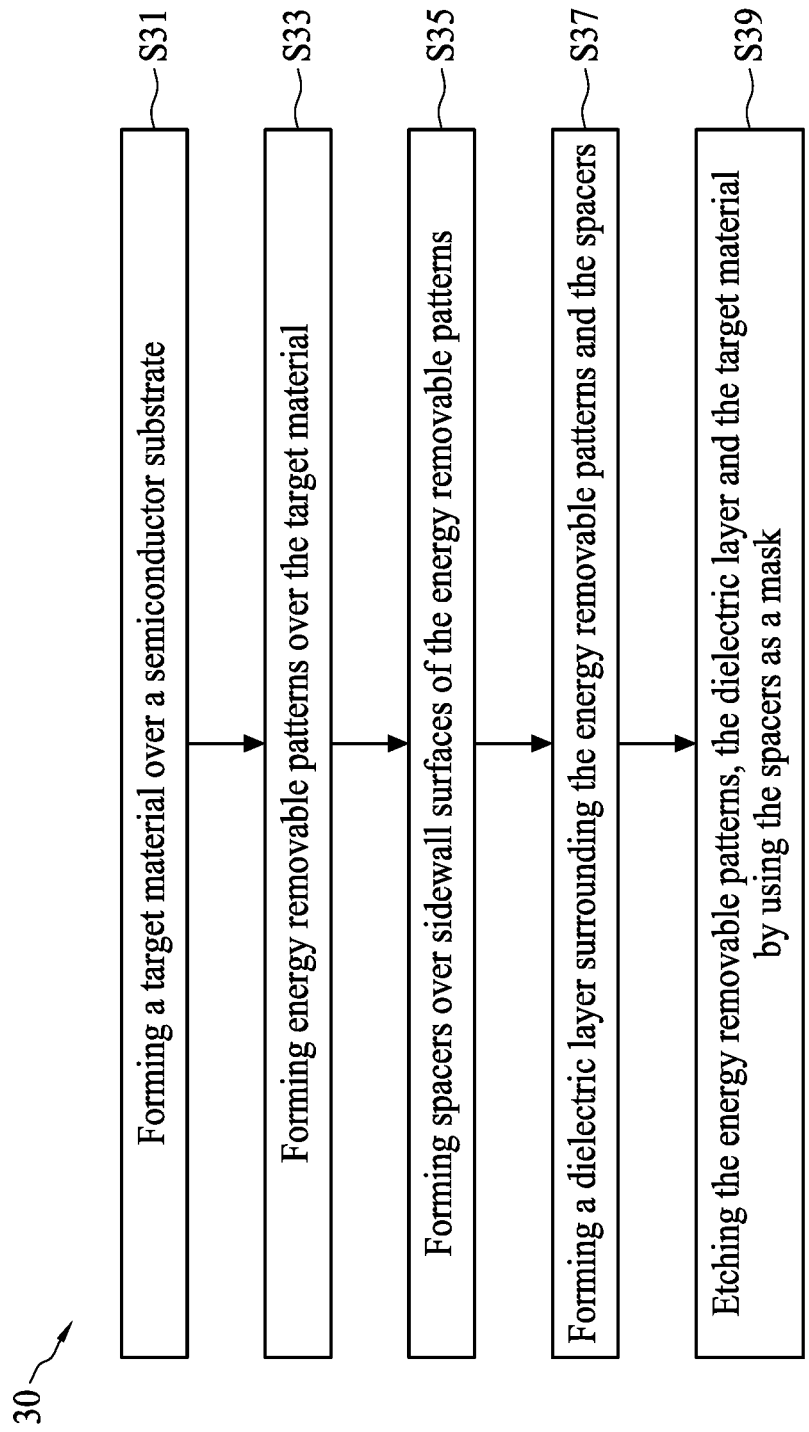
FIG. 7 is a flow diagram illustrating a method of forming a semiconductor device structure, in accordance with some embodiments.

FIG. 7 is a flow diagram illustrating a method 30 of forming the semiconductor device structure 300, wherein the method 30 includes steps S31, S33, S35, S37 and S39, in accordance with some embodiments. The steps S31 to S39 of FIG. 7 are elaborated in connection with FIGS. 17, 18, 19, 20 and 4, which are cross-sectional views illustrating sequential intermediate stages in the formation of the semiconductor device structure 300, in accordance with some embodiments.

Figure 17:
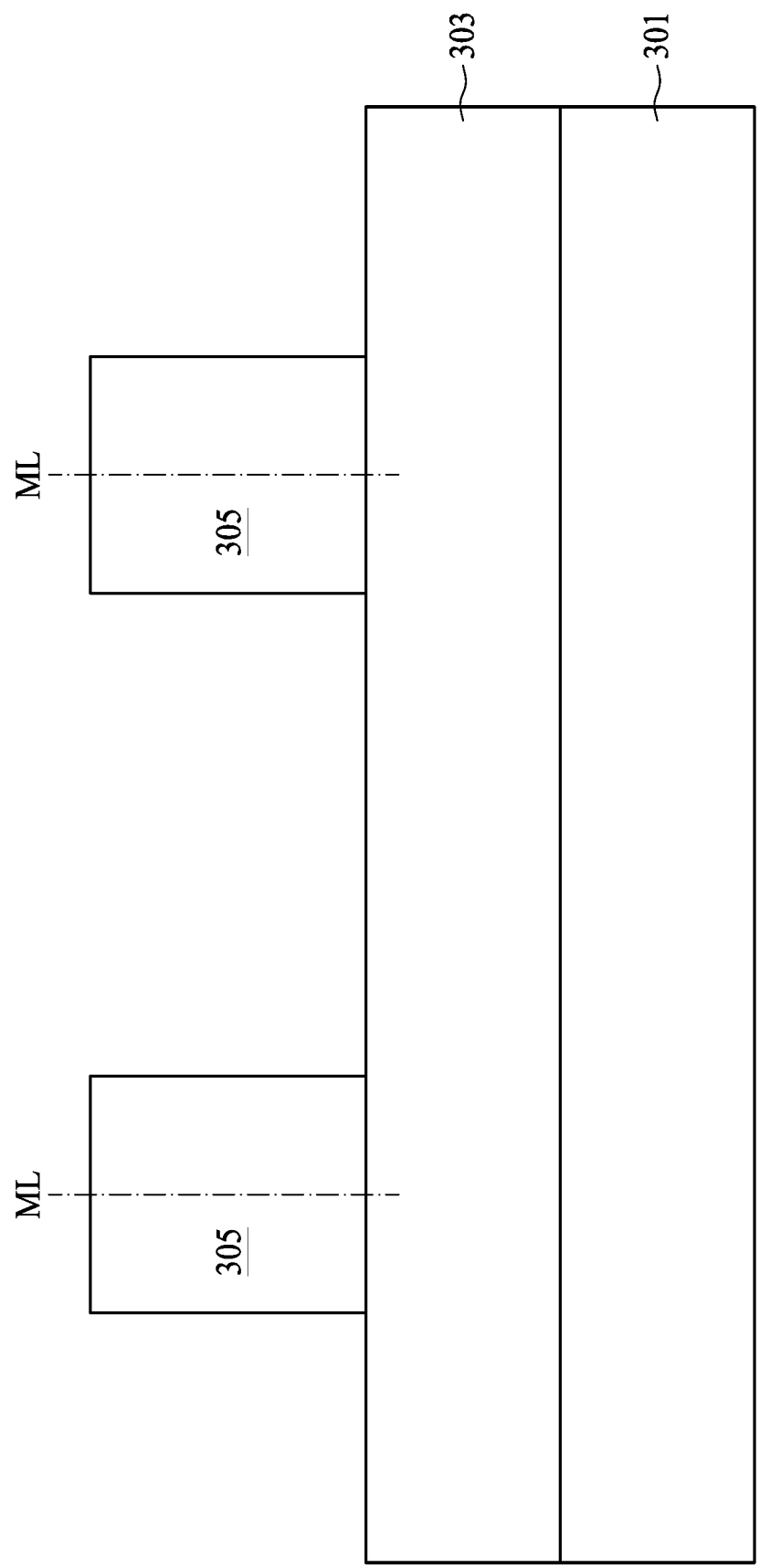
FIG. 17 is a cross-sectional view illustrating an intermediate stage in the formation of an energy removable pattern over a semiconductor device structure, in accordance with some embodiments.

As shown in FIG. 17, the semiconductor substrate 301 is provided, and a target material 303 is disposed over the semiconductor substrate 301. The details of the semiconductor substrate 301 and the target material 303 may be similar to or the same as the details of the semiconductor substrate 201 and the target material 203, and descriptions thereof are not repeated herein. The respective step is illustrated as the step S31 in the method 30 shown in FIG. 7.

Still referring to FIG. 17, energy removable patterns 305 are disposed over the target material 303, in accordance with some embodiments. The respective step is illustrated as the step S33 in the method 30 shown in FIG. 7. In some embodiments, the energy removable patterns 305 include a thermal decomposable material. In some other embodiments, the energy removable patterns 305 include a photonic decomposable material, an e-beam decomposable material, or another applicable energy decomposable material. Specifically, in some embodiments, the energy removable patterns 305 include a base material and a decomposable porogen material that is substantially removed upon exposure to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can, in the subsequent processes, provide porosity to the space originally occupied by the energy removable patterns 305.

In some embodiments, the energy removable patterns 305 are formed by a deposition process and a patterning process. The deposition process may be CVD, PVD, ALD, spin coating, or another suitable process, and the patterning process for forming the energy removable patterns 305 may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

In some embodiments, the target material 203 includes a thermal decomposable material, a photonic decomposable material, an e-beam decomposable material, or another applicable energy decomposable material. It should be noted that the target material 203 and the energy removable patterns 305 include the same material, or the similar material, in accordance with some embodiments.

Figure 18:
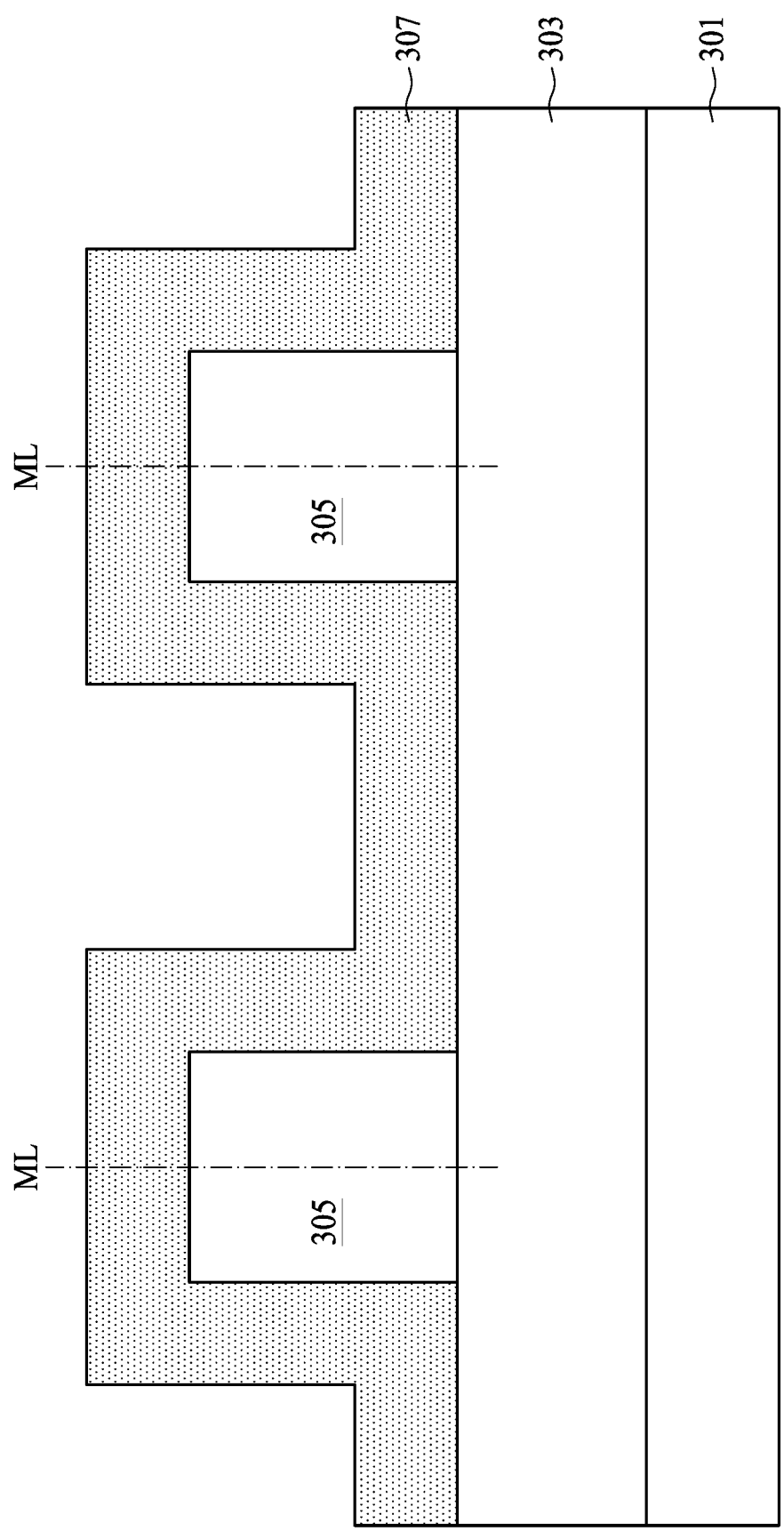
FIG. 18 is a cross-sectional view illustrating an intermediate stage in the formation of a conformal spacer material over the energy removable patterns, in accordance with some embodiments.

After the energy removable patterns 305 are formed, a spacer material 307 is conformally deposited over the top surfaces and the sidewall surfaces of the energy removable patterns 305 and the top surface of the target material 303, as shown in FIG. 18 in accordance with some embodiments.

In some embodiments, the spacer material 307 is made of boron nitride, and the deposition process for forming the spacer material 307 includes CVD, PVD, ALD, spin coating, or another suitable process: preferably, using ALD and/or PEALD techniques. In some embodiments, the material of the spacer material 307 is different from the material of the energy removable patterns 305. It should be noted that the material of the energy removable patterns 305 has a high etching selectivity against the material of the spacer material 307.

Figure 19:
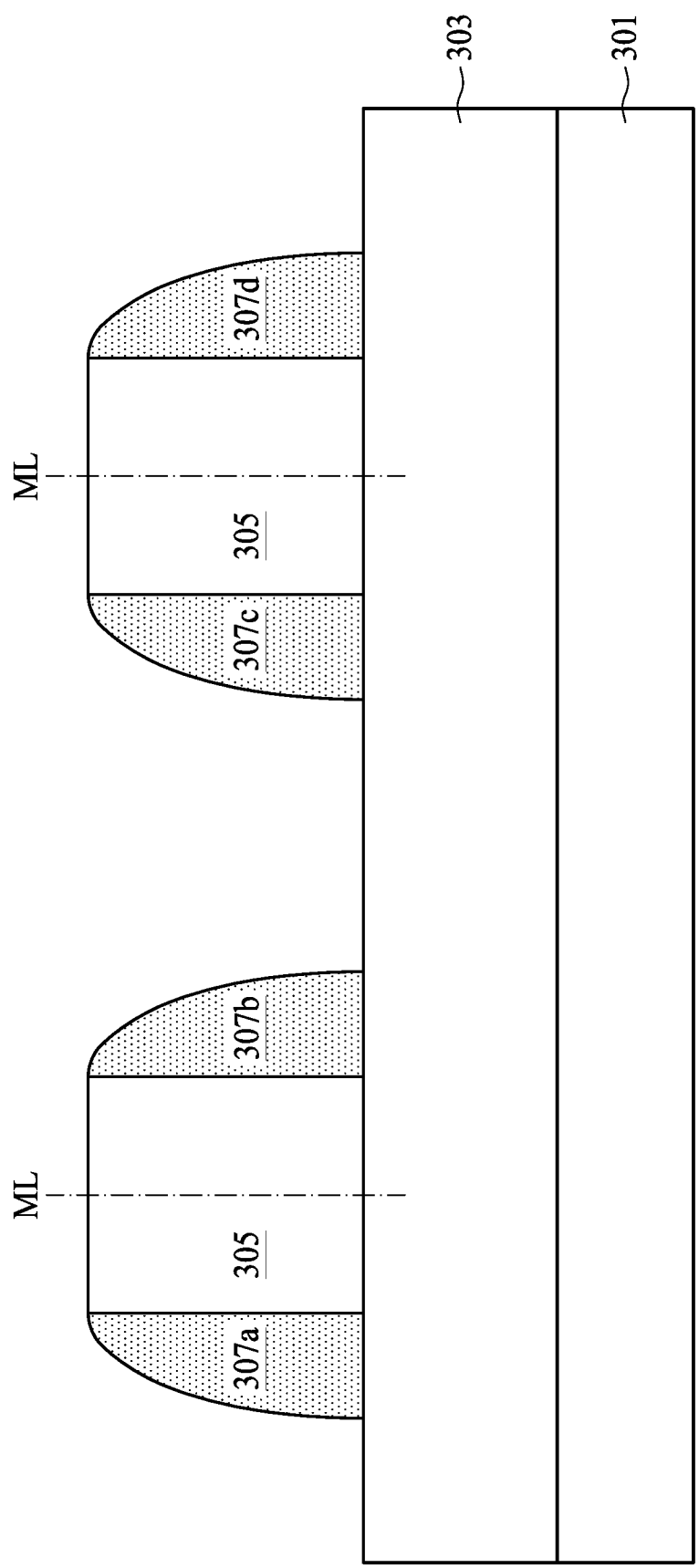
FIG. 19 is a cross-sectional view illustrating an intermediate stage in the formation of a spacer element over the semiconductor device structure, in accordance with some embodiments.

Next, the spacer material 307 is etched to form spacers 307a, 307b, 307c and 307d over sidewall surfaces of the energy removable patterns 305, as shown in FIG. 19 in accordance with some embodiments. The respective steps are illustrated as the step S35 in the method 30 shown in FIG. 7. In some embodiments, the etching process is an anisotropic etching process, which removes the same amount of the spacer material 307 vertically in all places, leaving the spacers 307a, 307b, 307c and 307d over the sidewall surfaces of the energy removable patterns 305. In some embodiments, the etching process is a dry etching process.

In some embodiments, the device is placed in a reaction chamber and is preferably heated to a temperature between 100 degrees Celsius and 500 degrees Celsius at a chamber pressure between 0.5 Torr and 10 Torr. More preferably, the temperature is between 300 degrees Celsius and 400 degrees Celsius, and the chamber pressure is between 0.5 Torr and 3 Torr.

In some embodiments, a boron precursor gas, such as one or more of boron trichloride ($BCl_3$), trimethylboron ($B(CH_3)_3$), diborane ($B_2H_6$), boron tribromide ($BBr_3$), or a precursor gas diluted with an inert gas such as helium (He) or argon (Ar), is then pulsed into the chamber where it is allowed to form a monolayer, or less than a monolayer, on the exposed surfaces of the device (i.e., surfaces of the gate stack, hardmask, semiconductor body, and, if present, the liner layer). In some embodiments, the boron precursor is pulsed for a time period between 2 seconds to 30 seconds at a flow rate ranging from 50 standard cubic centimeters (sccm) per minute to 1,000 sccm per minute. In some embodiments, the flow rate at which the boron precursor is pulsed into the chamber is between 100 sccm per minute and 500 sccm per minute.

In some embodiments, after the boron precursor is pulsed into the chamber, the chamber is purged with an inert gas, such as nitrogen (N2), argon (Ar), or helium (He), for an amount of time (e.g., 30 seconds) necessary to remove byproducts and all unreacted species from the chamber.

In some embodiments, a nitrogen-containing reactant gas, such as nitrogen, ammonia ($NH_3$), or a mixture of nitrogen and hydrogen ($H_2$), is then pulsed into the deposition chamber to react with the first layer and form a monolayer of boron-nitrogen. In some embodiments, the nitrogen-containing gas is pulsed into the chamber for a time period between 1 second and 10 seconds at a flow rate between 50 sccm per minute and 1,000 sccm per minute. In some embodiments, the flow rate at which the nitrogen-containing gas is pulsed is between 100 sccm per minute and 300 sccm per minute.

In some embodiments, PEALD techniques may also be used when providing the nitrogen-containing reactant gas to the chamber, whereby the boron-nitrogen bond forming reactions are assisted by dissociating the reactant gases using a plasma. In some embodiments, where PEALD is used, the plasma condition is created at a power between 50 W to 500 W and, more preferably, at a power between 100 W and 200 W.

In some embodiments, after pulsing the nitrogen-containing reactant gas, the chamber is again purged for an appropriate amount of time, and the cycle is repeated until deposition of the boron nitride layer has occurred to the desired thickness.

Figure 20:
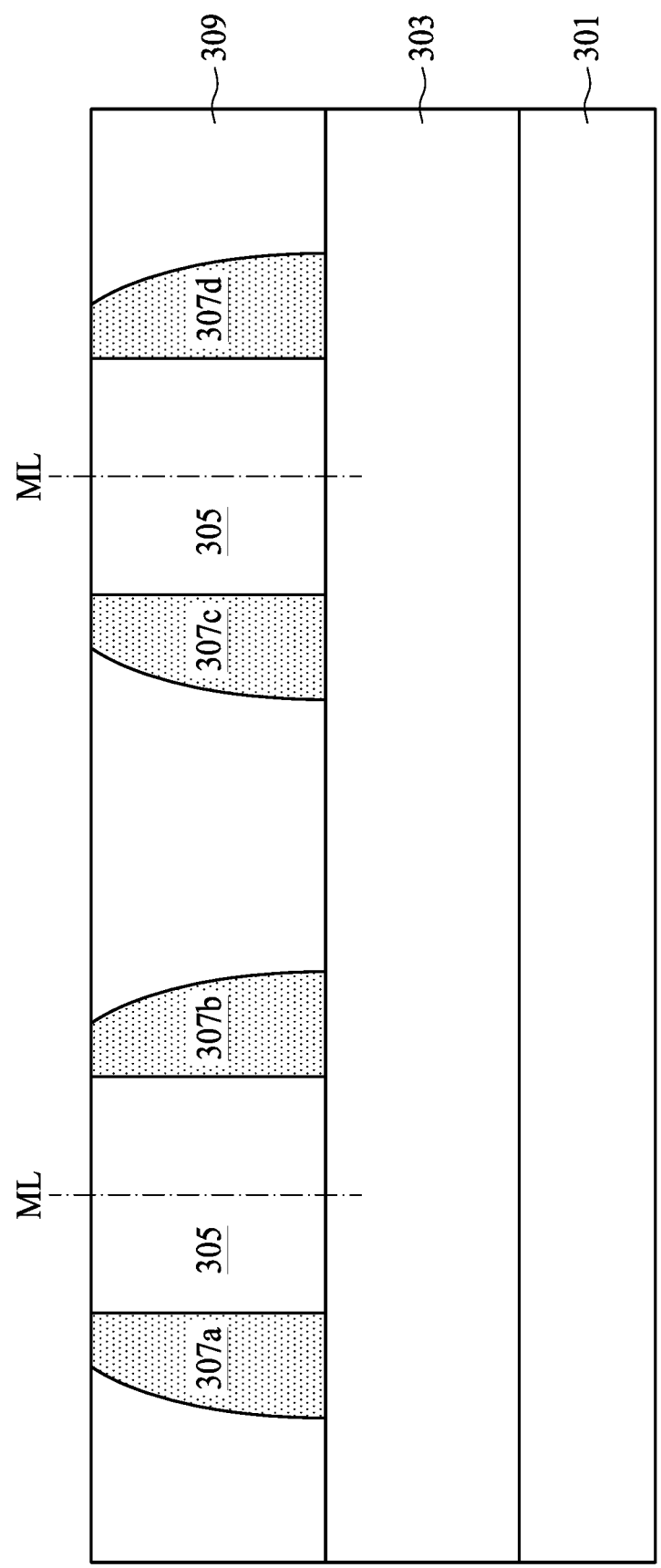
FIG. 20 is a cross-sectional view illustrating an intermediate stage in the formation of a dielectric layer surrounding the energy removable patterns and the spacers over semiconductor device structure, in accordance with some embodiments.

After the spacers 307a, 307b, 307c and 307d are formed, a dielectric layer 309 is formed surrounding the energy removable patterns 305 and the spacers 307a, 307b, 307c and 307d, as shown in FIG. 20 in accordance with some embodiments. The respective steps are illustrated as the step S37 in the method 30 shown in FIG. 7.

In some embodiments, the dielectric layer 309 includes silicon oxide, silicon carbide, silicon nitride, silicon oxynitride, one or more suitable dielectric materials, or a combination thereof. In some embodiments, the material of the dielectric layer 309 is different from the material of the spacers 307a, 307b, 307c and 307d. It should be noted that the material of the dielectric layer 309 has a high etching selectivity against the material of the spacers 307a, 307b, 307c and 307d.

In some embodiments, the dielectric layer 309 includes a thermal decomposable material, a photonic decomposable material, an e-beam decomposable material, or another applicable energy decomposable material. It should be noted that the dielectric layer 309 and the energy removable patterns 305 include the same material, or the similar material, in accordance with some embodiments.

In some embodiments, the dielectric layer 309 is formed by a deposition process and a subsequent planarization process. The deposition process may be CVD, PVD, ALD, spin coating, or another applicable process, and the planarization process may be a chemical mechanical polishing (CMP) process.

Figure 21:
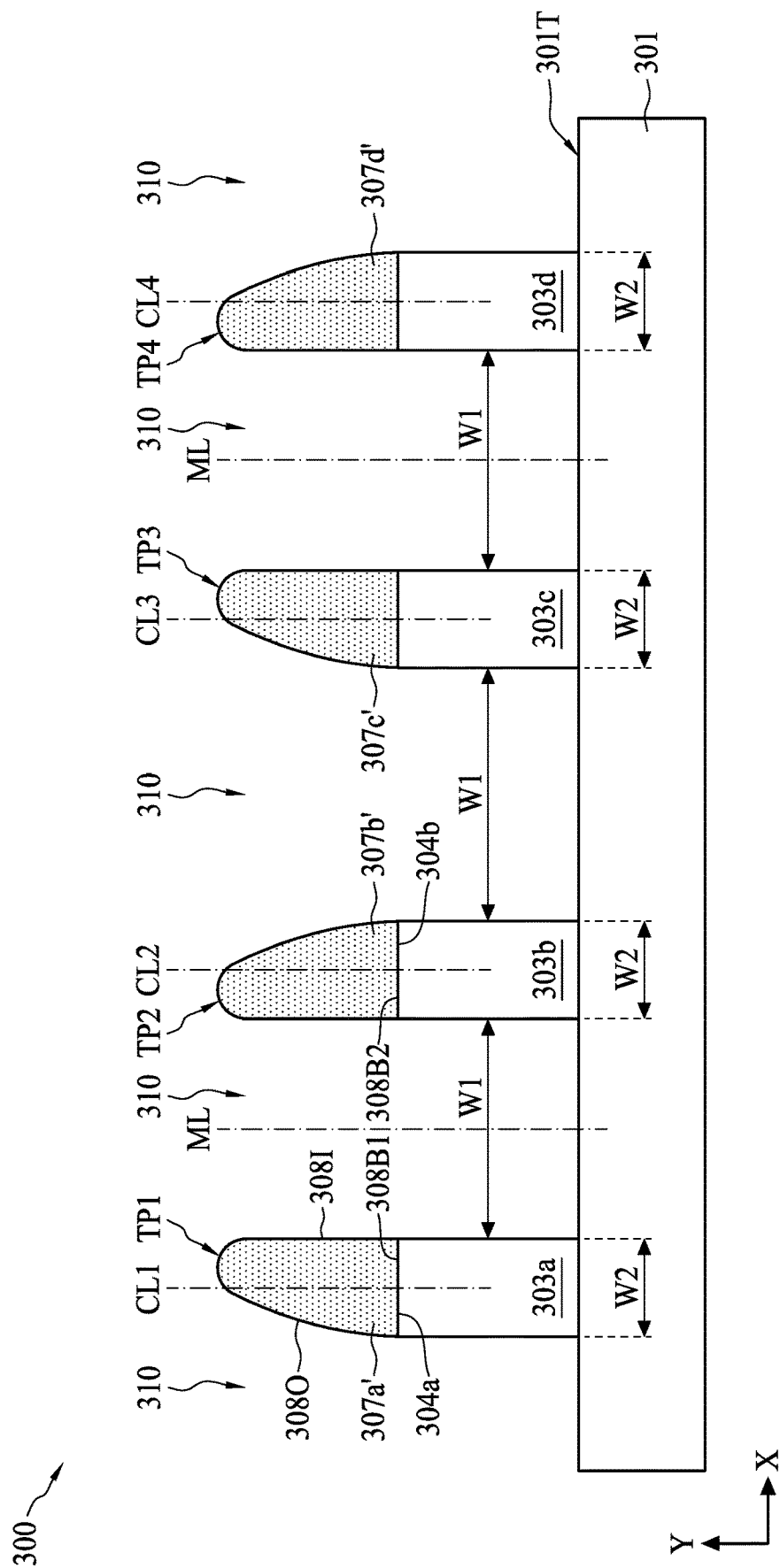
FIG. 21 is a cross-sectional view illustrating the formation of a semiconductor device structure after etching the energy removable patterns, the dielectric layer and the target material by using the spacers as an etching mask, in accordance with some embodiments

Next, the energy removable patterns 305, the dielectric layer 309 and the target material 303 are etched by using the boron nitride spacers 307a, 307b, 307c and 307d as an etching mask, as shown in FIG. 21 in accordance with some embodiments. The respective steps are illustrated as the step S39 in the method 30 shown in FIG. 7. In some embodiments, the etching process is a dry etching process. In some embodiments, referring to FIG. 21, the boron nitride spacer 307a' and the boron nitride spacer 307b' are substantially symmetric with respect to a middle line ML between the boron nitride spacer 307a' and the boron nitride spacer 307b'.

In some embodiments, referring to FIG. 21, the boron nitride spacer 307a' and the boron nitride spacer 307b' has a rounding top surfaces at the topmost point TP1 and the topmost point TP2, respectively, in the cross-sectional view. In some embodiments, referring to FIG. 21, the boron nitride spacer 307a' has an inner surface 308I and an outer surface 308O, the inner surface 308I faces the central line ML in the cross-sectional view, the outer surface 308O faces the opposite side, the inner surface 308I is substantially a non-curved surface, the outer surface 308O is substantially a curved surface, and the curvature of the inner surface 308I is smaller than that of the outer surface 308O.

In some embodiments, referring to FIG. 21, the target structure 303a has a top surface with a first top width 304a, the boron nitride spacer 307a' has bottom surface 308B1 with a first bottom width, the top surface 304a contacts the bottom surface 308B1, and the first top width is substantially the same as the first bottom width. In some embodiments, referring to FIG. 21, the target structure 303b has a top surface 304b with a second top width, the boron nitride spacer 307b' has bottom surface 308B2 with a second bottom width, the top surface 304b contacts the bottom surface 308B2, and the second top width is substantially the same as the second bottom width.

In some embodiments, referring to FIG. 21, the openings 310 have the same width W1, and the target structures 303a, 303b, 303c and 303d have the same width W2. In some embodiments, the width W1 is designed to be the same as the width W2, i.e., equal spaces and patterns. In some embodiments, the semiconductor device structure 300 includes a film structure (not shown in the drawings) over the semiconductor substrate 301. In some embodiments, the target structures 303a, 303b, 303c and 303d are formed over the film structure, serving as fine patterns, which can be used as a hard mask in the subsequent fabrication process for patterning corresponding fine patterns in the film structure.

In some embodiments, the energy removable patterns 305 are entirely removed, and the target structures 303a, 303b, 303c and 303d are formed by etching through the target material 303, in accordance with some embodiments. In addition, the spacers 307a, 307b, 307c and 307d are slightly etched to form boron nitride spacers 307a', 307b', 307c' and 307d'. It should be noted that the material of the energy removable patterns 305 has a high etching selectivity against the material of the spacers 307a, 307b, 307c and 307d (i.e., the material of the boron nitride spacers 307a', 307b', 307c' and 307d') during the etching process.

The material of the energy removable patterns 305 has a first etching selectivity against the material of the spacers 307a, 307b, 307c, 307d, the material of the dielectric layer 309 has a second etching selectivity against the material of the spacers 307a, 307b, 307c, 307d, and the material of the target material 303 has a third etching selectivity against the material of the spacers 307a, 307b, 307c, 307d. In some embodiments, the first etching selectivity, the second etching selectivity and the third etching selectivity are similar to each other.

Since the energy removable patterns 305, the dielectric layer 309 and the target material 303 have high etching selectivities against the spacers 307a, 307b, 307c, 307d in the etching process for forming the boron nitride spacers 307a', 307b', 307c', 307d', the etching process may be performed all the way down to the top surface 301T of the semiconductor substrate 301 while avoiding the collapse of the boron nitride spacers 307a', 307b', 307c' and 307d'.

In one embodiment of the present disclosure, a semiconductor device structure is provided. The semiconductor device structure includes a first inner boron nitride spacer disposed over a top surface of a semiconductor substrate. The first inner boron nitride spacer includes a first portion, a second portion, and a third portion between the first portion and the second portion. A height of the first portion and a height of the second portion are less than a height of the third portion, and a width of the first portion increases continuously as the first portion extends toward the top surface of the semiconductor substrate. The semiconductor device structure also includes a first outer boron nitride spacer disposed over the second portion of the first inner boron nitride spacer.

In some embodiments, the first portion of the first inner boron nitride spacer includes a first side adjoining a lower portion of a first sidewall surface of the third portion, a second side adjoining the top surface of the semiconductor substrate, and an exterior surface connected to the first side and the second side. The exterior surface has a convex shape. In some embodiments, the first outer boron nitride spacer adjoins a second sidewall surface of the third portion, and the first outer boron nitride spacer is separated from the top surface of the semiconductor substrate by the second portion. In some embodiments, the first inner boron nitride spacer is a stress-extension film, and the first outer boron nitride spacer is a stress-compression film. In some embodiments, the first inner boron nitride spacer is a stress-compression film, and the first outer boron nitride spacer is a stress-extension film. In some embodiments, the semiconductor device structure further includes a second inner boron nitride spacer and a second outer boron nitride spacer. The second inner boron nitride spacer is disposed over the top surface of the semiconductor substrate, and the second inner boron nitride spacer includes a fourth portion, a fifth portion, and a sixth portion between the fourth portion and the fifth portion. A width of the fourth portion increases continuously as the fourth portion extends toward the top surface of the semiconductor substrate, and the fourth portion is between the sixth portion and the first portion of the first inner boron nitride spacer. The second outer boron nitride spacer is disposed over the fifth portion of the second inner boron nitride spacer. In some embodiments, the fourth portion of the second inner boron nitride spacer is separated from the first portion of the first inner boron nitride spacer.

In another embodiment of the present disclosure, a semiconductor device structure is provided. The semiconductor device structure includes a target layer disposed over a semiconductor substrate, and a first target structure disposed over the target layer. The first target structure incudes a first portion, a second portion, and a third portion connected to the first portion and the second portion. A height of the first portion and a height of the second portion are greater than a height of the third portion. The semiconductor device structure also includes a first boron nitride spacer disposed over the first portion of the first target structure, and a second boron nitride spacer disposed over the second portion of the first target structure.

In some embodiments, the first target structure and the target layer are made of the same material, and the first boron nitride spacer and the second boron nitride spacer are made of the same material. In some embodiments, a topmost point of the first boron nitride spacer is between a central line of the first portion and a central line of the second portion in a cross-sectional view. In some embodiments, a topmost point of the second boron nitride spacer is between the central line of the first portion and the central line of the second portion in the cross-sectional view. In some embodiments, the semiconductor device structure further includes a second target structure, a third boron nitride spacer, and a fourth boron nitride spacer. The second target structure is disposed over the target layer. The second target structure includes a fourth portion, a fifth portion, and a sixth portion connected to the fourth portion and the fifth portion, and the fourth portion, the fifth portion and the sixth portion form a U-shaped structure. The third boron nitride spacer is disposed over the fourth portion of the second target structure, and the fourth boron nitride spacer is disposed over the fifth portion of the second target structure. In some embodiments, the third boron nitride spacer is between the second boron nitride spacer and the fourth boron nitride spacer, and a topmost point of the third boron nitride spacer is between a central line of the fourth portion and a central line of the fifth portion in a cross-sectional view. In some embodiments, a first opening between the second boron nitride spacer and the third boron nitride spacer is deeper than a second opening between the first boron nitride spacer and the second boron nitride spacer. In some embodiments, the semiconductor device structure further includes a hard mask structure formed between the first boron nitride spacer and the first portion of the first target structure, and the hard mask structure has a high etching selectivity against the first boron nitride spacer.

In yet another embodiment of the present disclosure, a semiconductor device structure is provided. The semiconductor device structure includes a first target structure and a second target structure disposed over a semiconductor substrate. The semiconductor device structure also includes a first boron nitride spacer disposed over the first target structure, wherein a topmost point of the first boron nitride spacer is between a central line of the first target structure and a central line of the second target structure in a cross-sectional view.

In some embodiments, the semiconductor device structure further includes a second boron nitride spacer disposed over the second target structure, wherein a topmost point of the second boron nitride spacer is between the central line of the first target structure and the central line of the second target structure in the cross-sectional view. In some embodiments, the first target structure has a high etching selectivity against the first boron nitride spacer. In some embodiments, the first target structure and the second target structure are made of a thermal decomposable material, a photonic decomposable material, or an e-beam decomposable material. In some embodiments, a top surface of the semiconductor substrate is exposed between the first target structure and the second target structure.

Embodiments of a semiconductor device structure and methods for forming the same are provided. The method for forming the semiconductor device structure may include undercutting a photoresist pattern over a semiconductor substrate, and forming an inner boron nitride spacer over a sidewall surface of the photoresist pattern. The inner boron nitride spacer has a portion extending into a recess (i.e., the undercut region) of the photoresist pattern to form a footing, and a width of the portion of the inner boron nitride spacer increases continuously as the portion extends toward the semiconductor substrate. As a result, the inner boron nitride spacer may be prevented from collapsing after removal of the photoresist pattern.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device structure, comprising:
a first target structure and a second target structure disposed over a semiconductor substrate; and
a first boron nitride spacer disposed over the first target structure, wherein a topmost point of the first boron nitride spacer is between a central line of the first target structure and a central line of the second target structure in a cross-sectional view;
wherein the first boron nitride spacer has a rounding top surface in the cross-sectional view and the rounding top surface includes a curved portion facing the central line of the second target structure in the cross-sectional view, and the topmost point of the first boron nitride spacer is deposited at a top of the curved portion of the rounding top surface.

2. The semiconductor device structure of claim 1, further comprising:
a second boron nitride spacer disposed over the second target structure, wherein a topmost point of the second boron nitride spacer is between the central line of the first target structure and the central line of the second target structure in the cross-sectional view.

3. The semiconductor device structure of claim 2, wherein the second boron nitride spacer has a rounding top surface in the cross-sectional view.

4. The semiconductor device structure of claim 2, wherein the first boron nitride spacer and the second boron nitride spacer are substantially symmetric with respect to a middle line between the first boron nitride spacer and the second boron nitride spacer.

5. The semiconductor device structure of claim 2, wherein the second target structure has a second top width, the second boron nitride spacer has a second bottom width, and the second top width is substantially the same as the second bottom width.

6. The semiconductor device structure of claim 1, wherein the first target structure has a high etching selectivity against the first boron nitride spacer.

7. The semiconductor device structure of claim 1, wherein the first target structure and the second target structure are made of a thermal decomposable material, a photonic decomposable material, or an e-beam decomposable material.

8. The semiconductor device structure of claim 1, wherein a top surface of the semiconductor substrate is exposed between the first target structure and the second target structure.

9. The semiconductor device structure of claim 1, wherein the first target structure has a first top width, the first boron nitride spacer has a first bottom width, and the first top width is substantially the same as the first bottom width.

10. The semiconductor device structure of claim 1, wherein the first boron nitride spacer has an inner surface and an outer surface, the inner surface faces the central line of the second target structure in the cross-sectional view, the inner surface substantially includes a non-curved surface, and the outer surface substantially includes a curved surface.

11. The semiconductor device structure of claim 1, wherein the first boron nitride spacer has an inner surface and an outer surface, the inner surface faces the central line of the second target structure in the cross-sectional view, and a curvature of the inner surface is smaller than that of the outer surface.

* * * * *